(12) United States Patent
Park et al.

(10) Patent No.: US 10,230,039 B2
(45) Date of Patent: Mar. 12, 2019

(54) FLEXIBLE DEVICE AND OPERATING METHODS THEREOF

(71) Applicant: SAMSUNG ELECTRONICS CO., LTD., Suwon-si (KR)

(72) Inventors: Jin Park, Yongin-si (KR); Woo-seok Chin, Hwaseong-si (KR); Ji-yeon Jung, Siheung-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/784,565

(22) Filed: Oct. 16, 2017

(65) Prior Publication Data

US 2018/0040803 A1 Feb. 8, 2018

Related U.S. Application Data

(63) Continuation of application No. 13/974,770, filed on Aug. 23, 2013, now Pat. No. 9,818,928.

(30) Foreign Application Priority Data

Aug. 23, 2012 (KR) .................. 10-2012-0092609

(51) Int. Cl.
| | |
|---|---|
| *H01L 41/08* | (2006.01) |
| *G06F 1/16* | (2006.01) |
| *G06F 3/01* | (2006.01) |
| *G06F 3/041* | (2006.01) |
| *H01L 41/04* | (2006.01) |
| *G02F 1/1333* | (2006.01) |
| *H01L 41/09* | (2006.01) |

(52) U.S. Cl.
CPC ........ *H01L 41/0825* (2013.01); *G06F 1/1652* (2013.01); *G06F 3/016* (2013.01); *G06F 3/0412* (2013.01); *H01L 41/042* (2013.01); *G02F 1/133305* (2013.01); *H01L 41/0926* (2013.01)

(58) Field of Classification Search
CPC .................... G06F 1/1652; G06F 2203/04102
See application file for complete search history.

(56) References Cited

U.S. PATENT DOCUMENTS

| | | |
|---|---|---|
| 7,474,038 B2 | 1/2009 | Takahashi et al. |
| 8,302,486 B2 | 11/2012 | Cosentino |
| 8,365,589 B2 | 2/2013 | Schreiner et al. |
| 8,380,327 B2 | 2/2013 | Park |

(Continued)

FOREIGN PATENT DOCUMENTS

| | | |
|---|---|---|
| CN | 101867013 A | 10/2010 |
| CN | 102026833 A | 4/2011 |

(Continued)

OTHER PUBLICATIONS

Communication dated Dec. 12, 2013, issued by the European Patent Office in counterpart European Application No. 13181574.8.

(Continued)

*Primary Examiner* — Benjamin C Lee
*Assistant Examiner* — Dong Hui Liang
(74) *Attorney, Agent, or Firm* — Sughrue Mion, PLLC

(57) ABSTRACT

A flexible device includes a flexible body and a plurality of piezoelectric materials arranged on the flexible body that deform in response to drive signals causing deformation of the flexible body of the flexible device.

19 Claims, 30 Drawing Sheets

(56) References Cited

U.S. PATENT DOCUMENTS

| | | |
|---|---|---|
| 8,390,594 B2 | 3/2013 | Modarres et al. |
| 8,878,806 B2 | 11/2014 | Modarres et al. |
| 2005/0253643 A1 | 11/2005 | Inokawa et al. |
| 2007/0205701 A1 | 9/2007 | Grumm |
| 2007/0228886 A1 | 10/2007 | Takahashi et al. |
| 2008/0303782 A1* | 12/2008 | Grant .................... G06F 1/1615 345/156 |
| 2008/0316281 A1 | 12/2008 | Loyer |
| 2009/0250267 A1 | 10/2009 | Heubel et al. |
| 2010/0126281 A1 | 5/2010 | Cosentino |
| 2011/0011172 A1 | 1/2011 | Schreiner et al. |
| 2011/0043077 A1 | 2/2011 | Yeh et al. |
| 2011/0043454 A1 | 2/2011 | Modarres et al. |
| 2011/0187681 A1 | 8/2011 | Kim et al. |
| 2011/0188189 A1* | 8/2011 | Park ........................ G05B 11/01 361/679.05 |
| 2011/0245633 A1* | 10/2011 | Goldberg ............... A61B 5/681 600/301 |
| 2011/0261021 A1 | 10/2011 | Modarres et al. |
| 2012/0127136 A1 | 5/2012 | Schneider et al. |
| 2012/0161578 A1 | 6/2012 | Shimada et al. |
| 2012/0242592 A1 | 9/2012 | Rothkopf et al. |
| 2013/0131887 A1 | 5/2013 | Park |
| 2013/0162579 A1 | 6/2013 | Modarres et al. |
| 2014/0002419 A1* | 1/2014 | Thorson .................. G06F 3/147 345/175 |
| 2014/0327531 A1 | 11/2014 | Modarres et al. |

FOREIGN PATENT DOCUMENTS

| | | |
|---|---|---|
| CN | 102339166 A | 2/2012 |
| CN | 102576250 A | 7/2012 |
| EA | 201100893 A1 | 1/2012 |
| EP | 2357548 A2 | 8/2011 |
| EP | 2381340 A2 | 10/2011 |
| JP | 2002-196876 A | 7/2002 |
| JP | 2004-171512 A | 6/2004 |
| JP | 2005-6259 A | 1/2005 |
| JP | 2007-274865 A | 10/2007 |
| JP | 2008220127 A | 9/2008 |
| JP | 2008-256518 A | 10/2008 |
| JP | 2011-242386 A | 12/2011 |
| KR | 10-2011-0088870 A | 8/2011 |
| RU | 2009144035 A | 6/2011 |
| WO | 2010063320 A1 | 6/2010 |

OTHER PUBLICATIONS

International Search Report (PCT/ISA/210) dated Dec. 23, 2013, issued in International Application No. PCT/KR2013/007578.
Written Opinion (PCT/ISA/237) dated Dec. 23, 2013, issued in International Application No. PCT/KR2013/007578.
Written Opinion dated Dec. 7, 2015 by the Intellectual Property Office of Singapore in counterpart Singaporean Application No. 11201500334P.
Communication dated Jul. 1, 2016, issued by the Intellectual Property Office of Singapore in counterpart Singaporean Application No. 11201500334P.
Communication dated Aug. 4, 2016, issued by the Australian Intellectual Property Office in counterpart Australian Application No. 2013306550.
Communication dated Oct. 9, 2016, from the State Intellectual Property Office of People's Republic of China in counterpart Application No. 201380048112.8.
Communication dated Dec. 13, 2016, issued by the Australian Patent Office in counterpart Australian Application No. 2013306550.
Communication dated Jan. 24, 2017 issued by Intellectual Property Office of Singapore in counterpart Singaporean Patent Application No. 11201500334P.
Communication dated Jun. 13, 2017, issued by the State Intellectual Property Office of the People's Republic of China in counterpart Chinese Patent Application No. 201380048112.8.
Communication dated Jul. 12, 2017, issued by the Korean Intellectual Property Office in counterpart Korean Patent Application No. 10-2012-0092609.
Communication dated Aug. 21, 2017, issued by the Japanese Patent Office in counterpart Japanese Patent Application No. 2015-528404.
Communication dated Sep. 6, 2017, issued by the Russian Patent Office in counterpart Russian Application No. 2015109958.
Communication dated Nov. 16, 2017 by the State Intellectual Property Office of P.R. China in counterpart Chinese Patent Application No. 201380048112.8.
Communication dated Mar. 9, 2018 issued by the Australian Patent Office in counterpart Australian Patent Application No. 2017201925.
Communication dated May 17, 2018 issued by the State Intellectual Property Office of P.R. China in counterpart Chinese Patent Application No. 201380048112.8.
Communication dated Aug. 10, 2018 issued by the European Patent Office in counterpart European Patent Application No. 13181574.8.

* cited by examiner

FLEXIBLE DEVICE AND OPERATING METHODS THEREOF

CROSS-REFERENCE TO RELATED APPLICATIONS

This application is a continuation of U.S. patent application Ser. No. 13/974,770 filed on Aug. 23, 2013, in the U.S. Patent and Trademark Office, which claims priority from Korean Patent Application No. 10-2012-0092609, filed on Aug. 23, 2012, in the Korean Intellectual Property Office, the disclosure of which is incorporated herein by reference in its entirety.

BACKGROUND

1. Field

Devices and methods consistent with exemplary embodiments relate to a flexible device and operating methods thereof, and more particularly, to a flexible device which changes form using a plurality of piezoelectric substances and operating methods thereof.

2. Description of the Related Art

Advancement in the electronic technology has enabled development of various types of electronic devices. Conventional display devices are widely used, such as televisions, personal computers, laptop computers, tablets, mobile phones, and MP3 players.

To meet customer's desires for new devices, a 'next-generation display device' is being developed.

One example of the next-generation display device is a flexible display device. The 'flexible display device' refers to a display device configured to change its form.

The flexible display device may change form in response to a user's force exerted thereon.

Accordingly, a flexible device structure and operation method thereof are necessary to meet the user's various desires.

SUMMARY

Exemplary embodiments overcome the above disadvantages and other disadvantages not described above. Also, the exemplary embodiments are not required to overcome the disadvantages described above, and an exemplary embodiment may not overcome any of the problems described above.

According to exemplary embodiments, a flexible device is provided that can change form using a plurality of piezoelectric substances, and operating methods thereof.

According to an aspect of an exemplary embodiment, there is provided a flexible device including a flexible body, a lower piezoelectric layer of a first plurality of piezoelectric materials disposed on the flexible body, an intermediate layer disposed on the lower piezoelectric layer, an upper piezoelectric layer of a second plurality of piezoelectric materials disposed on the intermediate layer, and a flexible display panel supported by the flexible body.

The flexible device may additionally include a controller configured to apply a drive signal to at least one of the first plurality of piezoelectric materials of the lower layer and the second plurality of piezoelectric materials of the upper layer, the drive signal causing the at least one of the first plurality of piezoelectric materials and second plurality of piezoelectric materials to deform, in response to detecting an event.

The drive signal comprises a first drive signal and a second drive signal, the at least one of the first plurality of piezoelectric materials and the second plurality of piezoelectric materials comprises the first plurality of piezoelectric materials and the second plurality of piezoelectric materials, the first plurality of piezoelectric materials deform in a first direction, in response to application of the first drive signal to the first plurality of piezoelectric materials of the lower piezoelectric layer and the second plurality of piezoelectric materials deform in a second direction, in response to application of the second drive signal to the second plurality of piezoelectric materials of the upper piezoelectric layer, and the first plurality of piezoelectric materials and the second plurality of piezoelectric materials maintain a balanced state, in response to application of the first drive signal or the second drive signal to the first plurality of piezoelectric materials and the second plurality of piezoelectric materials.

The controller divides the first plurality of piezoelectric materials and the second plurality of piezoelectric materials into a plurality of groups based on locations at which the first plurality of piezoelectric materials and the second plurality of piezoelectric materials are disposed, and applies different ones of the first drive signal and the second drive signal to the respective groups to cause the grouped first plurality of piezoelectric materials and the second plurality of piezoelectric materials to locally deform.

The flexible device may additionally include a display. The first plurality of piezoelectric materials and the second plurality of piezoelectric materials are disposed on a lower portion of the display, the controller selectively applies the first drive signal and the second drive signal to the first plurality of piezoelectric materials and the second plurality of piezoelectric materials based on a type of the event, and the controller controls the display to display a user interface (UI) corresponding to a deformation state of the flexible body corresponding to the deformation of the first plurality of piezoelectric materials and the second plurality of piezoelectric materials on the display.

The flexible device may additionally include a display, at least one biosensor configured to detect a touch of a user arranged on lower side of the display. The first plurality of piezoelectric materials and the second plurality of piezoelectric materials are disposed between the display and the at least one biosensor, and the controller selectively applies the first drive signal and the second drive signal to the first plurality of piezoelectric materials and the second plurality of piezoelectric materials and controls the display to display a user interface on the display, in response to the at least one biosensor detecting the touch of the user.

The first plurality of piezoelectric materials are disposed in a column-wise direction and the second plurality of piezoelectric materials are disposed in a row-wise direction.

The lower piezoelectric layer, the intermediate layer, and the upper piezoelectric layer are stacked sequentially on one side of the flexible body.

The magnitude of the drive signal corresponds to a degree of deformation of the at least one of the first plurality of piezoelectric materials and the second plurality of piezoelectric materials.

The flexible device may additionally include a detector configured to detect an electric signal generated from one or more piezoelectric materials of the first plurality of piezoelectric materials and the second plurality of piezoelectric materials in response to a deformation of the flexible body. The controller determines a deformation state of the flexible body based on a change in the electric signal and performs a control operation corresponding to the determined deformation state.

According to an aspect of an exemplary embodiment, there is provided a method for operating a flexible device, which may include detecting, by a controller of the flexible device, occurrence of an event and selectively applying drive signals to a first plurality of piezoelectric materials of a lower piezoelectric layer disposed on a flexible body of the flexible device and a second plurality of piezoelectric materials of an upper piezoelectric layer disposed on the first plurality of piezoelectric materials, based on the event. The drive signals cause deformation of the first plurality of piezoelectric materials and the second plurality of piezoelectric materials.

According to aspects of the exemplary embodiments, it is possible to deform the flexible device using a plurality of piezoelectric materials. As a result, utilization of flexible device further increases.

BRIEF DESCRIPTION OF THE DRAWINGS

The above and other aspects will be more apparent by describing certain exemplary embodiments with reference to the accompanying drawings, in which.

DETAILED DESCRIPTION OF EXEMPLARY EMBODIMENTS

Figure 1:
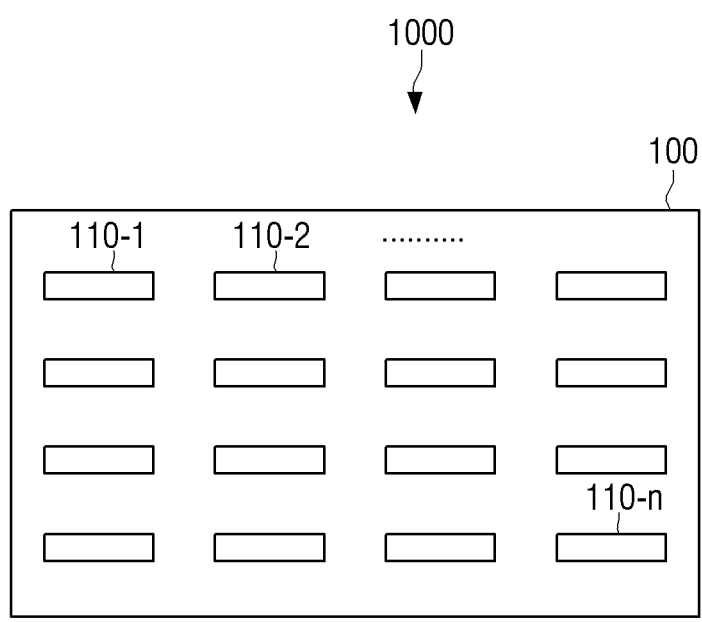
FIG. 1 illustrates a constitution of a flexible device according to an exemplary embodiment.

Certain exemplary embodiments will now be described in greater detail with reference to the accompanying drawings.

In the following description, same drawing reference numerals are used for the same elements even in different drawings. The matters defined in the description, such as detailed construction and elements, are provided to assist in a comprehensive understanding of the present inventive concept. Accordingly, it is apparent that the exemplary embodiments may be carried out without those specifically defined matters. Also, well-known functions or constructions are not described in detail because they would obscure the invention with unnecessary detail.

FIG. 1 is a view provided to explain a constitution of a flexible device according to an exemplary embodiment. Referring to FIG. 1, the flexible device 1000 includes a body 100 and a plurality of piezoelectric substances 110-1~110-n.

Respective components of the flexible device 100 are mounted to the body, which is flexible and may be deformed.

The body may be made from plastic material (e.g., polymer film) that can deform in response to an external pressure. To be specific, the body 100 may be configured as a base film coated on both surfaces with barrier coating. The base film may be formed from various resin such as, for example, polyimide (PI), polycarbonate (PC), polyethyleneterephtalate (PET), polyethersulfone (PES), polythylenenaphthalaten (PEN), or fiber reinforced plastic (FRP). The barrier coating may be applied on both surfaces of the base film, respectively. Organic or inorganic film may be used as the barrier coating to maintain flexibility. Additionally, the body 100 may be formed from various other materials exhibiting flexibility, such as, for example, a metal foil, etc.

The plurality of piezoelectric materials 110-1~110-n may be mounted to surface or interior of the body 100. To be specific, the plurality of piezoelectric materials 110-1~110-n may be arranged at different positions of the body 100. FIG. 1 illustrates an example in which the plurality of piezoelectric materials 110-1~110-n are formed at predetermined intervals on one surface of the body 100 in horizontal and vertical rows, thus forming a matrix pattern. Although the piezoelectric materials 110-1~110-n in the exemplary embodiment illustrated in FIG. 1 are depicted at uniform intervals from each other, the number, locations, and pattern of arrangement of the piezoelectric materials 110-1~110-n are not restricted to any specific example, and may be variously modifiable depending on application.

The plurality of piezoelectric materials 110-1~110-n may be disposed in which two different piezoelectric layers are arranged. For convenience of explanation, the piezoelectric layer on the upper portion is referred to as the 'upper piezoelectric layer', while the piezoelectric layer under the upper piezoelectric layer is referred to as the 'lower piezoelectric layer'.

The flexible device 1000 utilizes piezoelectric effect of the respective piezoelectric materials 110-1~110-n. That is, when a user exerts pressure by deforming the body 100 having the piezoelectric materials 110-1~110-n therein, the respective piezoelectric materials 110-1~110-n are subject to dielectric polarization due to the exerted pressure, and thus generate electric signals. Therefore, direct piezoelectric effect, or a first piezoelectric effect occurs. On the contrary, with the application of electric field to the respective piezoelectric materials 110-1~110-n, the form of the piezoelectric materials 110-1~110-n changes due to the electric field, and this is an inverse piezoelectric effect, or a second piezoelectric effect. The effects mentioned above are collectively referred to as the 'piezoelectric effect'. According to an exemplary embodiment illustrated in FIG. 1, the flexible device 1000 can change the form of the body 100 by using the piezoelectric effect, or to be more specific, any combination of the first piezoelectric effect and the second piezoelectric effect.

Figure 2:
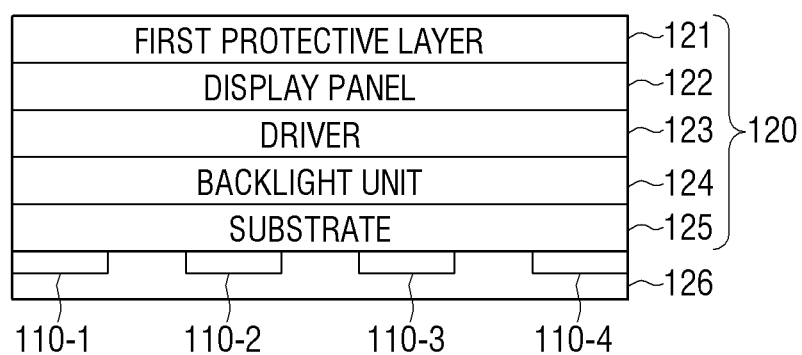
FIG. 2 is a cross-section view of the flexible device of FIG. 1.

FIG. 2 illustrates a cross-section of the flexible device 1000 according to an embodiment. Referring to FIG. 2, the flexible device 1000 includes a display 120. The display 120 includes a first protective layer 121, a display panel 122, a driver 123, a backlight unit 124 and a substrate 125.

The first protective layer 121 protects the display panel 122. For example, the first protective layer 121 may be formed from a material, such as ZrO, CeO$_2$, or ThO$_2$. The first protective layer 121 may be formed as a transparent film to cover the entire surface of the display panel 122.

The display panel 122 may be implemented as a liquid crystal display (LCD), organic light-emitting diode (OLED), electrophoretic display (EPD), electrochromic display (ECD), or plasma display panel (PDP). For implementation as an LCD, the backlight unit 124, as illustrated in FIG. 2, is necessary. The backlight unit 124 may include a light source, such as lamps or an LED, in direct edge type arrangement, to provide backlight to the direction of the display panel 122.

The driver 123 drives the display panel 122. To be specific, the driver 123 applies a driving voltage to a plurality of pixels of the display panel 122. The driver 123 may be implemented as a thin film transistor (TFT), low temperature poly silicon (LTPS) TFT, or organic TFT (OTFT). The driver 123 may take various configurations according to how the display panel 122 is formed. For example, the display panel 122 may include an organic light emitter of a plurality of pixel cells, and electrode layers covering both surfaces of the organic light emitter. The driver 123 may include a plurality of transistors corresponding to the respective pixel cells of the display panel 122. The respective transistors illuminate pixel cells connected thereto, with the application of electric signal thereto. As a result, an image is displayed on the display panel 122. Although not illustrated in FIG. 2, a color filter may additionally be provided. The respective components illustrated in FIG. 2 are fabricated into an organic structure containing carbon or a thin flexible structure, such as a foil.

The display 120 may alternatively be implemented as electric paper (e-paper). The e-paper may be implemented using semispheric twist balls charged with electrostatic charge, an electrophoresis display method using electrophoresis and microcapsule, or a display method using cholesterol liquid crystal.

The substrate 125 supports the components. The substrate 125 may be a plastic substrate formed from various material including, for example, polyimide (PI), polycarbonate (PC), polyethyleneterephtalate (PET), polyethersulfone (PES), polythylenenaphthalate (PEN), or fiber reinforced plastic (FRP).

The plurality of piezoelectric materials 110-1~110-n are arranged under the substrate 125 in various configurations.

The piezoelectric materials 110-1~110-n are covered by the second protective layer 126. The second protective layer 126 may be formed from a flexible material, such as rubber or plastic. Although the exemplary embodiment illustrated in FIG. 2 shows the second protective layer 126 filling in gaps between the piezoelectric materials 110-1~110-n, in another exemplary embodiment, the gaps between the piezoelectric materials 110-1~110-n may be left as empty spaces.

The piezoelectric materials 110-1~110-n may be formed into various configurations such as, for example, unimorph type, bimorph type or stack type. The 'unimorph type' refers to a configuration in which one piezoelectric layer is stacked on disc-shaped metal layer. The 'bimorph type' refers to a configuration in which two piezoelectric layers are stacked in sequence. The 'stack type' refers to a configuration in which metal electrode material is printed on ceramic sheet, after which several sheets are compressed and the compressed structure including electrode therein is sintered.

Figure 3:
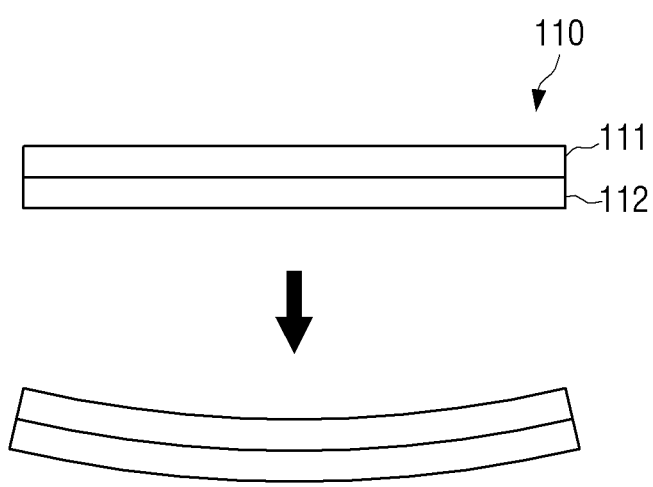
FIGS. 3 to 5 illustrates a constitution of one piezoelectric substance according to various exemplary embodiments.

FIG. 3 illustrates a cross-section of a unimorph type piezoelectric material. Referring to FIG. 3, the unimorph type piezoelectric material 110 includes a metal layer 112, and a piezoelectric layer 111 stacked on the surface of the metal layer 112. In plan view, the metal layer 112 and the piezoelectric layer 111 may have circular configuration. The piezoelectric layer 111 may be formed from piezoelectric ceramic or piezoelectric polymer. For piezoelectric ceramic, various materials such as PZT, PbTiO$_3$, BaTiO$_3$ are applicable.

With the application of drive signal of first polarity to the piezoelectric layer 111, as illustrated, the edge area moves upward, while the central area moves downward. With the application of drive signal of second polarity, which is opposite to the first polarity, the form is changed in the opposite manner.

Figure 4:
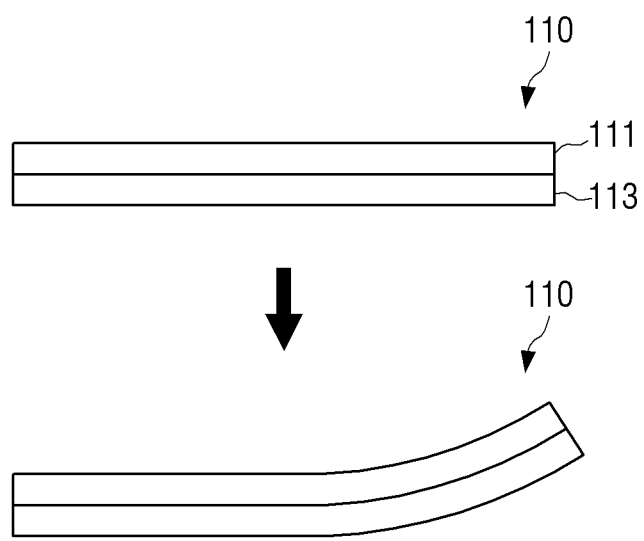

FIG. 4 shows a cross-section of bimorph type piezoelectric material. Referring to FIG. 4, the bimorph type piezoelectric material 110 includes an upper piezoelectric layer 111 and a lower piezoelectric layer 113. The upper and lower piezoelectric layers 111, 113 are extended upon application of a first polarity drive signal, while these constrict upon application of a second polarity drive signal. The first polarity may be positive (+), and the second polarity may be negative (−). The piezoelectric material 110 bends to the direction of the second piezoelectric layer 113, when the first piezoelectric layer 111 is extended and the second piezoelectric layer 113 is constricted. On the contrary, the piezoelectric material 110 bends to the direction of the first piezoelectric layer 111 when the first piezoelectric layer 111 is constricted and the second piezoelectric layer 113 is extended.

Figure 5:
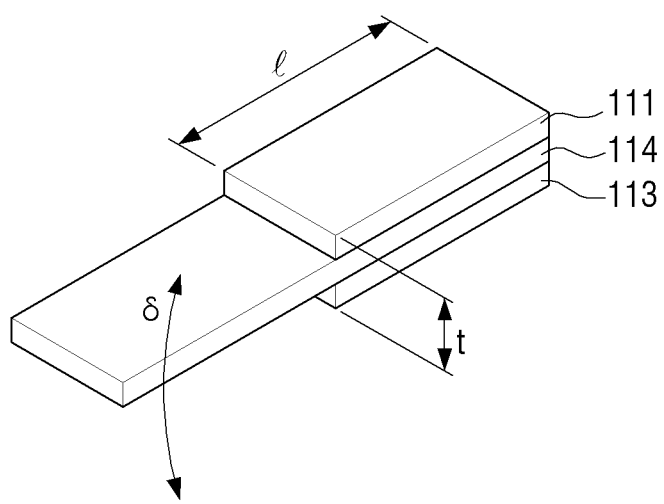

FIG. 5 illustrates another example of constitution of a bimorph type piezoelectric material. Referring to FIG. 5, an intermediate layer 114 may be provided between the upper and lower piezoelectric layers 111, 113 within the piezoelectric material 110.

The intermediate layer 114 may be formed from a flexible elastic material. The intermediate layer 114 may have a shape of a rectangular parallelepiped with thin thickness. The upper piezoelectric layer 111 is stacked on the upper surface of the intermediate layer 114, and the lower piezoelectric layer 113 is stacked on the lower surface of the intermediate layer 114. As explained above, the upper and lower piezoelectric layers 111, 113 may be formed from various piezoelectric materials. Referring to FIG. 5, the upper and lower piezoelectric layers 111, 113 may be configured to partially cover the intermediate layer 114. That is, the intermediate layer 114 may be formed to have a longer length. The lengths of the respective piezoelectric layers 111, 113 and the intermediate layer 114 may be determined based on the data measured through experiments.

For example, the frequency and displacement according to the length of the intermediate layer 114 may be measured as follows by the experiment.

TABLE 1

|  | Int. Layer (mm) | | | | |
| --- | --- | --- | --- | --- | --- |
|  | 80 | 90 | 100 | 110 | 120 |
| Piezo. Layer (mm) | 30 | 30 | 30 | 30 | 30 |
| Frequency (Hz) | 40.621 | 32.389 | 24.845 | 20.045 | 19.875 |
| Displacement (mm) | 8.64 | 12.92 | 13.78 | 6.44 | 6.545 |

Table 1 lists displacements measured by varying the length of the intermediate layer 114 to 80, 90, 100, 110, 120 mm under the condition that each end of the piezoelectric layers 111, 113 and intermediate layer 114 is aligned to each other, and the lengths of the piezoelectric layers 111, 113 are fixed at 30 mm. According to Table 1, the maximum displacement is measured when the length of the intermediate layer 114 is 100 mm, which is shorter than the maximum length (i.e., 120 mm). The 'displacement' refers to a width δ of the other end of the intermediate layer 114 deformed in upward and downward direction.

The displacement may be expressed by the following mathematical formula.

$$\delta = k \cdot d_{31} \cdot V \cdot l^2 \cdot /t^2$$ <Mathematical Formula 1> where, δ denotes displacement, k is integer, $d_{31}$ is piezoelectric constant, V is applied voltage, l is length of piezoelectric layer, and t is thickness. According to Mathematical Formula 1, the displacement δ increases in proportion to applied voltage, i.e., to drive signal.

Although FIG. 5 illustrates that the intermediate layer 114 to be longer than the piezoelectric layers 111, 113, in another exemplary embodiment, the lengths of the intermediate layer 114 and the piezoelectric layers 111, 113 may be equal. Further, the direction of the piezoelectric material 110 bending may be determined according to a voltage difference between the first drive signal applied to the upper piezoelectric layer 111 and the second drive signal applied to the lower piezoelectric layer 113.

A method for adjusting a direction of deformation of the piezoelectric material 110 inclusive of the upper piezoelectric layer 111, the intermediate layer 114, and the lower piezoelectric layer 113 in equal length will be explained below with reference to FIGS. 6 and 7.

Figure 6:
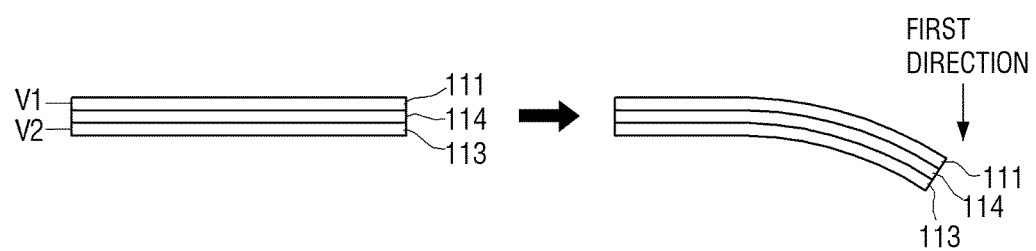
FIG. 6 is a view provided to explain bending of a piezoelectric substance in response to a first drive signal applied thereto.

Referring first to FIG. 6, the first drive signal V1 is applied to the upper piezoelectric layer 111, and the second drive signal V2 is applied to the lower piezoelectric layer 113. The upper piezoelectric layer 111 extends and the lower piezoelectric layer 113 contracts when the first drive signal V1 is positive (+), and the second drive signal V2 is negative (−). As a result, the piezoelectric material 110 bends in the first direction. The piezoelectric material 110 may bend in the first direction even when V1 and V2 have same polarity, if V1 is larger than V2.

Figure 7:
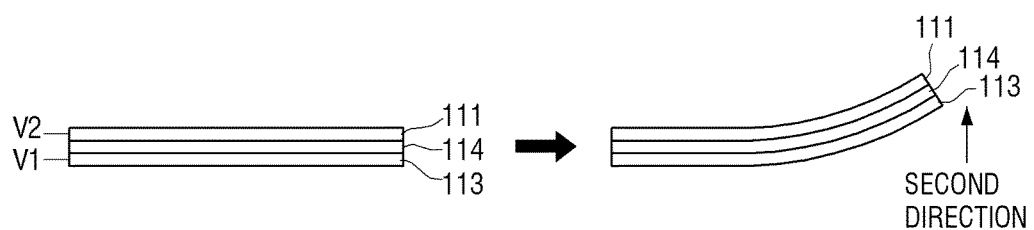
FIG. 7 is a view provided to explain bending of a piezoelectric substance in response to a second drive signal applied thereto.

FIG. 7 illustrates a situation where V1 and V2 are applied in opposite direction to that illustrated in FIG. 6. According to FIG. 7, the piezoelectric material 110 bends to the second direction which is opposite to the first direction.

When the piezoelectric material 110 bends as illustrated in FIGS. 6 and 7, the body 110 of the flexible device 1000 to which the piezoelectric material 110 is attached also bends.

Figure 8:
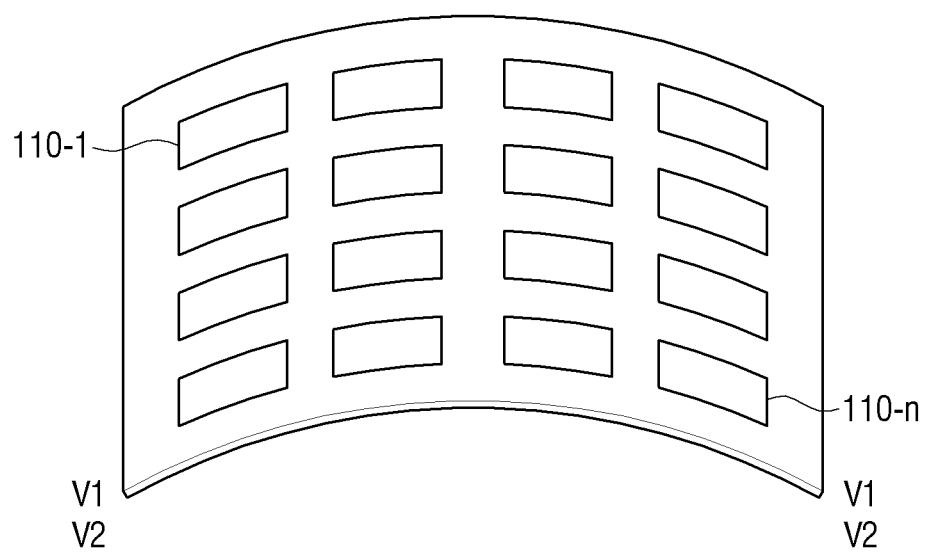
FIGS. 8 and 9 are views provided to explain how a flexible device change a form in response to bending piezoelectric substance.
Figure 9:
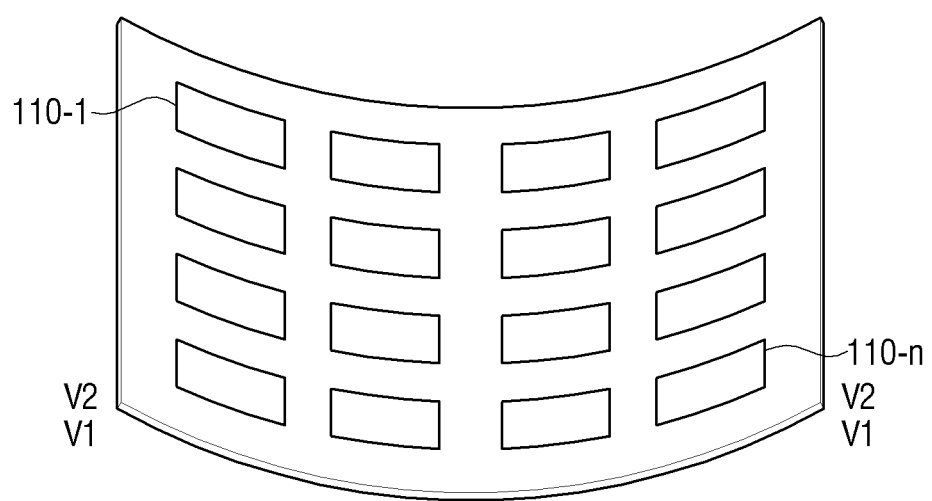

FIG. 8 illustrates a situation in which the body 100 bends in the first direction when the piezoelectric materials 110-1~110-n mounted to the body 100 bend in the first direction, as illustrated in FIG. 6. Conversely, FIG. 9 illustrates a situation in which the body 100 bends in the second direction when the piezoelectric materials 110-1~110-n mounted to the body 100 bend in the second direction, as illustrated in FIG. 7.

Meanwhile, the upper and lower piezoelectric layers 111, 113 both have the same piezoelectric effect when the same drive signal is applied to the upper and lower piezoelectric layers 111, 113.

Figure 10:
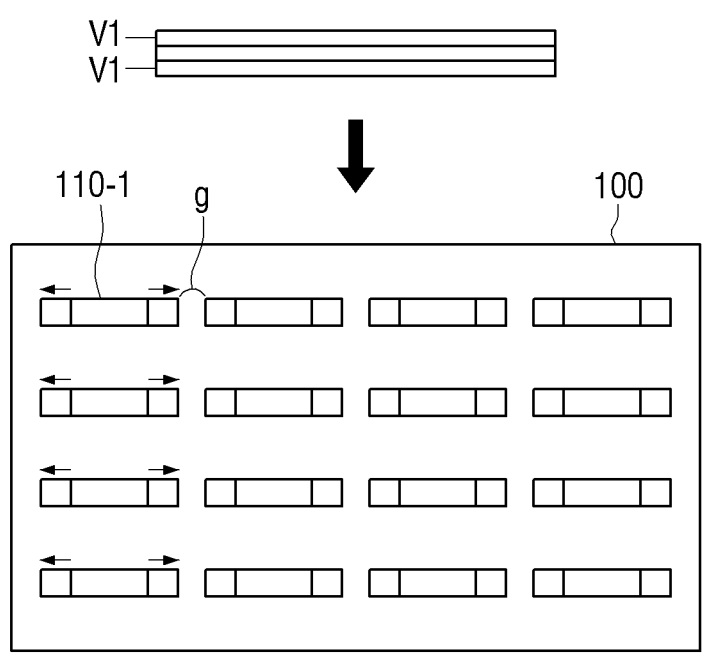
FIG. 10 is a view provided to explain a situation when the same drive signal is applied to an upper piezoelectric layer and a lower piezoelectric layer of a piezoelectric substance.

FIG. 10 illustrates a situation in which the same drive signal is applied. Referring to FIG. 10, the respective piezoelectric materials 110 maintain a balanced state and extend lengthwise, when the (+) polarity first drive signal V1 is applied to the upper and lower piezoelectric layers 111, 113. Accordingly, the gap (g) between the respective piezoelectric materials decreases, as illustrated in FIG. 10, thus creating a compressive effect and reinforcing the body 100 of the flexible device 1000.

Figure 11:
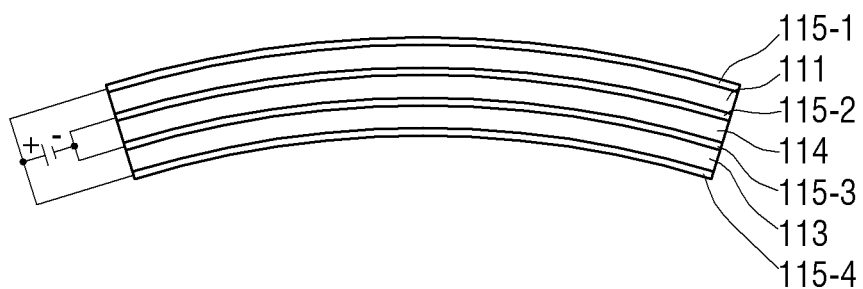
FIGS. 11 and 12 are views provided to explain a constitution to apply a drive signal to a piezoelectric substance.
Figure 12:
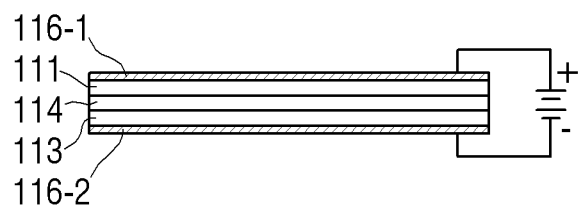

FIGS. 11 and 12 are views provided to explain various examples of a structure to apply a drive signal of a bimorph type piezoelectric material.

Referring to FIG. 11, the piezoelectric material 110 includes an upper piezoelectric layer 111, an intermediate layer 114, a lower piezoelectric layer 113, a first electrode 115-1 disposed on an upper surface of the upper piezoelectric layer 111, a second electrode 115-2 disposed between the upper piezoelectric layer 111 and the intermediate layer 114, a third electrode 115-3 disposed between the intermediate layer 114 and the lower piezoelectric layer 113, and a fourth electrode 115-4 disposed on a lower surface of the lower piezoelectric layer 113.

Referring to FIG. 11, a (+) polarity electric field is formed on the upper piezoelectric layer 111, when (+) voltage is applied to the first and fourth electrodes 115-1, 115-4, and (−) voltage is applied to the second and third electrodes 115-2, 115-3. As a result, the piezoelectric substance within the upper piezoelectric layer 111 polarizes according to the direction of the electric field, and the length of the crystals extends. That is, the upper piezoelectric layer 111 extends lengthwise. On the contrary, (−) polarity electric field is formed on the lower piezoelectric layer 113. Accordingly, the lower piezoelectric layer 113 constricts lengthwise. As a result, the piezoelectric material 110 bends to the direction of the lower piezoelectric layer 113, as illustrated in FIG. 11.

FIG. 12 illustrates an arrangement in which electrodes are provided on upper and lower sides of the piezoelectric material 110. Referring to FIG. 12, the piezoelectric material 110 includes an upper piezoelectric layer 111, an intermediate layer 114, a lower piezoelectric layer 113, a first electrode 116-1 disposed on an upper surface of the upper piezoelectric layer 111, and a second electrode 116-2 disposed on a lower surface of the lower piezoelectric layer 113. Accordingly, when (+) signal is applied to the first electrode 116-1 and (−) signal is applied to the second electrode 116-2, the upper piezoelectric layer 111 extends and the lower piezoelectric layer 113 constricts, so that the piezoelectric material 110 bends downward.

An electrode pattern may be provided to apply an individual drive signal to the upper and lower piezoelectric layers, respectively. The electrode pattern electrically connects electrodes connected to the upper and lower piezoelectric layers to an internal power circuit of the flexible device 1000. The electrode pattern may be formed on a lower portion of the substrate 125, as explained above, or within the second protective layer 126. Alternatively, the electrode pattern may be provided within the substrate 125 when a plurality of piezoelectric materials 110-1~110-n are embedded in the substrate 125.

Figure 13:
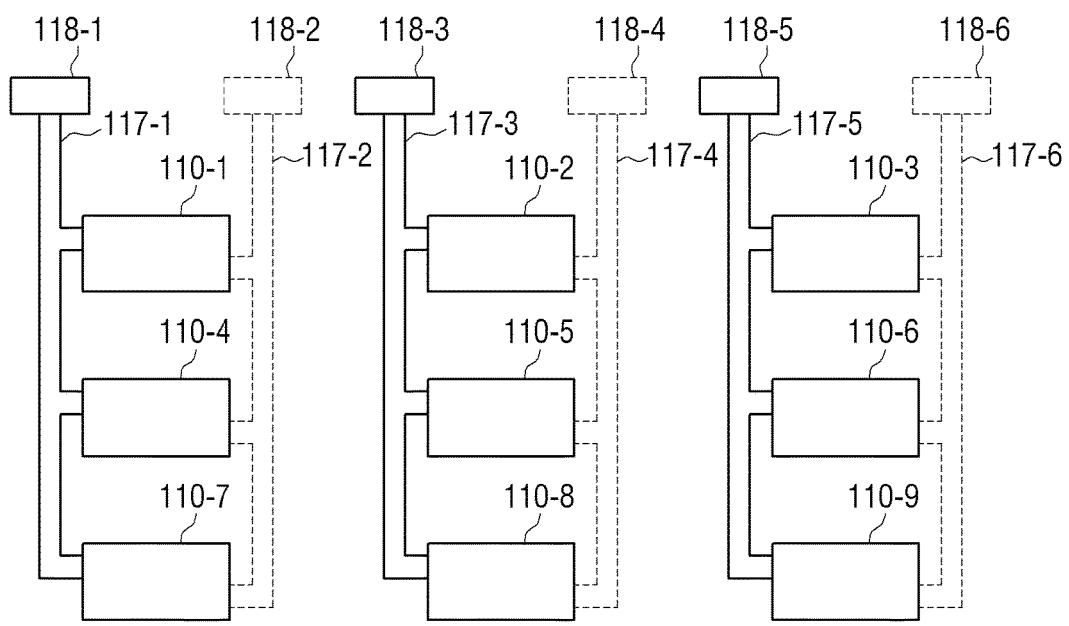
FIGS. 13 and 14 are views provided to explain an example of an electrode pattern connected to a plurality of piezoelectric substances.

FIG. 13 illustrates an electrode pattern according to an exemplary embodiment. Referring to FIG. 13, the flexible device 1000 includes upper electrode patterns 117-1, 117-3, 117-5 connected to the upper piezoelectric layer 111 of each of the piezoelectric materials 110-1~110-n, and lower electrode patterns 117-2, 117-4, 117-6 connected to the lower piezoelectric layer 113 of each of the piezoelectric materials 110-1~110-n.

The upper electrode patterns 117-1, 117-3, 117-5 and the lower electrode patterns 117-2, 117-4, 117-6 commonly connect the piezoelectric materials arranged on the same rows. That is, the first upper electrode pattern 117-1 is commonly connected to the lower piezoelectric layers 113 of the first, fourth, and seventh piezoelectric materials 110-1, 110-4, 110-7 arranged on the first row. Likewise, the piezoelectric materials arranged on the remaining rows are also commonly connected by the upper and lower electrode patterns corresponding to the rows of the piezoelectric materials.

The upper and lower electrode patterns 117-1, 117-3, 117-5, and 117-2, 117-4, 117-6 are connected to electrode pads 118-1~118-6. Accordingly, when a drive signal is applied to one electrode pad, the same drive signal may be provided to the piezoelectric materials which are commonly connected to the electrode pattern connected to the electrode pad in receipt of the drive signal.

FIG. 13 illustrates a situation where the piezoelectric materials are implemented in multi-layer structure. In one exemplary embodiment, the upper electrode patterns 117-1, 117-3, 117-5 may be formed on the same layer as the upper piezoelectric layer 111, and the lower electrode patterns 117-2, 117-4, 117-6 may be formed on the same layer as the lower piezoelectric layer 113. That is, the upper electrode patterns 117-1, 117-3, 117-5 may be formed on upper layer than the lower electrode patterns 117-2, 117-4, 117-6, as is illustrated in FIG. 13, in which the upper electrode patterns 117-1, 117-3, 117-5 are illustrated in solid lines, and the lower electrode patterns 117-2, 117-4, 117-6 are illustrated in dotted lines. Depending on application, a penetrating electrode may be extended through the layers.

In addition to the exemplary embodiment illustrated in FIG. 13, in which a plurality of piezoelectric materials are arranged in matrix pattern and driven in row-wise manner, alternative embodiments are possible. For example, the plurality of piezoelectric materials may be driven in column-wise manner, in which case upper electrode patterns (not illustrated) to commonly connect the upper piezoelectric layers (e.g., first, second, and third) arranged in columns, and lower electrode patterns (not illustrated) to commonly connect the lower piezoelectric layers of the piezoelectric materials arranged in columns, may be additionally provided. Further illustration and explanation about the column-wise electrode patterns will be omitted for the sake of brevity, as the artisan of ordinary skill will be easily able to understand the arrangement of the electrode patterns based on the row-wise, upper and lower electrode pattern. Although FIG. 13 illustrates only three upper electrode patterns, depending on embodiments, the number of electrode patterns may vary according to the number of piezoelectric materials.

Further, although FIG. 13 particularly illustrates an example in which a plurality of piezoelectric materials in row-wise or column-wise arrangement are uniformly driven, the piezoelectric materials may be driven as certain piezoelectric material unit.

Figure 14:
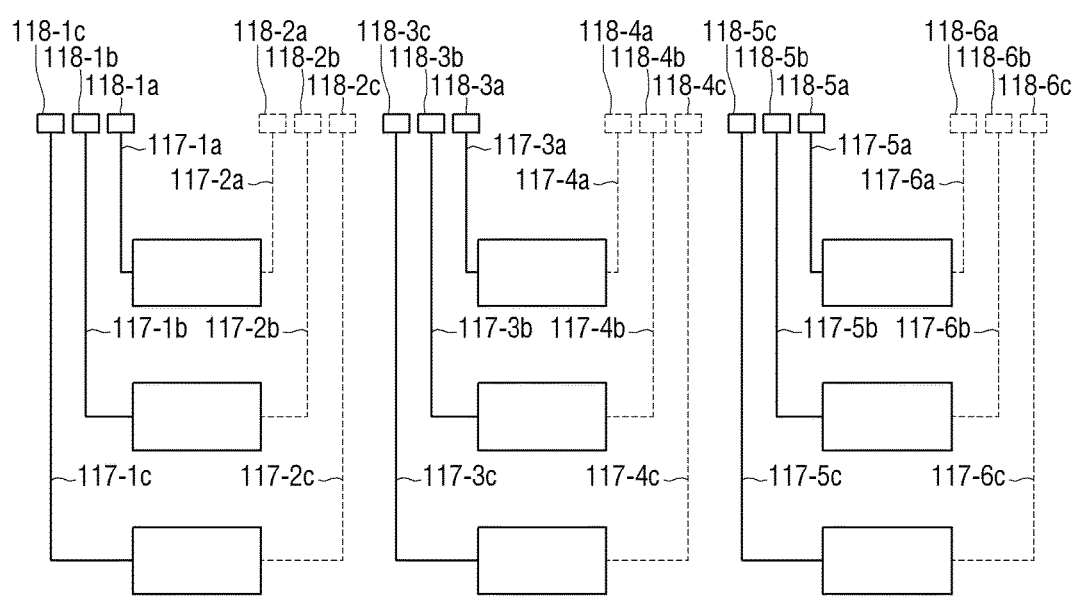

FIG. 14 illustrates an electrode pattern to drive a unit of piezoelectric material according to an embodiment.

Referring to FIG. 14, a plurality of upper electrode patterns 117-1a, 117-1b, 117-1c, 117-3a, 117-3b, 117-3c, 117-5a, 117-5b, 117-5c are individually connected to the upper piezoelectric layer of each piezoelectric material. Further, a plurality of lower electrode patterns 117-2a, 117-2b, 117-2c, 117-4a, 117-4b, 117-4c, 117-6a, 117-6b, 117-6c are individually connected to the lower piezoelectric layer of each piezoelectric material. Further, the upper and lower electrode patterns are connected to corresponding electrode pads 118-1a, 118-1b, 118-1c, 118-2a, 118-2b, 118-2c, 118-3a, 118-3b, 118-3c, 118-4a, 118-4b, 118-4c, 118-5a, 118-5b, 118-5c, 118-6a, 118-6b, 118-6c. The flexible device 1000 may deform the body 100 to a desired state, by applying a drive signal to the electrode pads connected to the piezoelectric materials at a location intended for deformation. The deformation operation will be explained in detail below.

Figure 15:
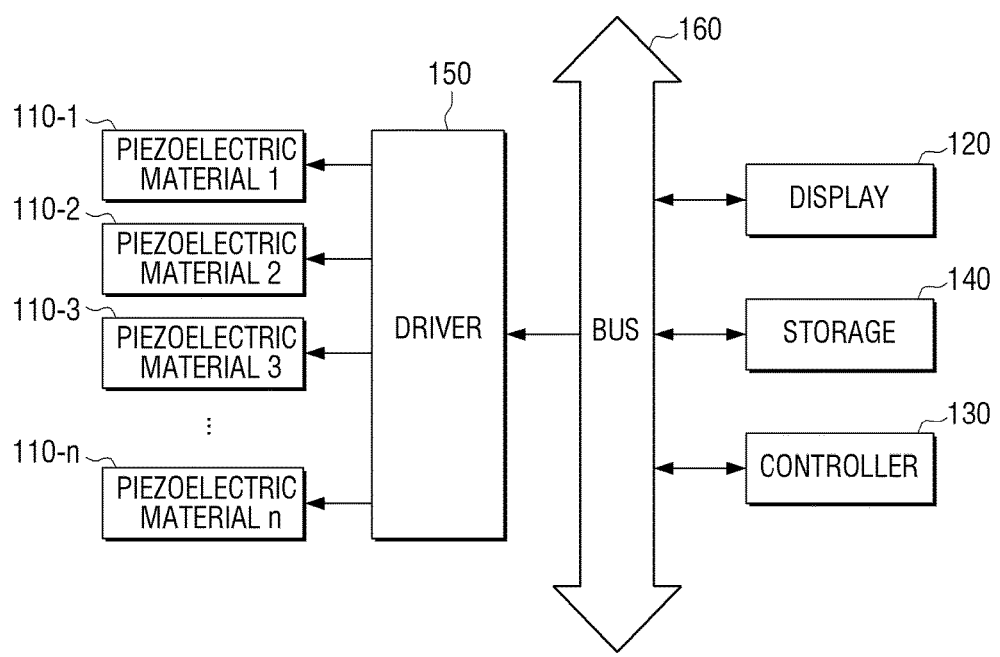
FIG. 15 is a block diagram provide to explain a constitution of a flexible device according to an exemplary embodiment.

FIG. 15 is a block diagram of a flexible device according to an exemplary embodiment. Referring to FIG. 15, the flexible device 1000 includes a plurality of piezoelectric materials 110-1~110-n, a display 120, a controller 130, a storage 140, a driver 150 and a bus 160.

The structure and a method for driving a plurality of piezoelectric materials 110-1~110-n will not be additionally explained, but referenced to the above corresponding description.

The display 120 is formed from flexible material and performs various display operations under control of the controller 130.

The driver 150 is configured to apply a drive signal to a plurality of piezoelectric materials 110-1~110-n. The driver 150 may generate drive signals of different sizes and polarities, using the power provided from a battery (not illustrated). The drive signal may be generated in the form of pulse signal.

The storage 140 stores an operating system (O/S) that controls the operation of the flexible device 100, applications, and other data. The controller 130 is driven by the O/S stored at the storage 140 to execute various applications.

The bus 160 is configured to transmit and receive data, or control signal among the respective components of the flexible device 1000. The bus 160 may include an address bus, a data bus, or a control bus. The address bus is used to transmit and receive address-related information, such as memory address, and the data bus is a bus system which connects the controller 130, the storage 140, and the other input/output for data exchange. The control bus is a bus system used by the controller 130, the storage 140, or the other components to transmit or receive various control signal. The control signal may include a memory sync signal, input/output sync signal, driving control signal, CPU status signal, interrupt request and permission signal, or clock signal.

The controller 130 controls the overall operation of the flexible device 1000 according to user manipulation. To be specific, upon receiving a turn-on command, the controller 130 may execute initialization program to boot up the flexible device 1000 and displays a background screen through the display 120. The background screen may include icons for various functions, applications, or folders. When a user selects one among the icons, the controller 130 performs a corresponding operation according to the selected icon.

When a preset event occurs, the controller 130 may control the driver 150 to apply a drive signal to at least one among the plurality of piezoelectric materials 110-1~110-$n$. To be specific, the controller 130 may provide the driver 150 with address signal to designate piezoelectric material to be driven among the respective piezoelectric materials 110-1~110-$n$ via the address bus, and also provides the driver 150 with direction signal to designate the order of driving via the control bus.

The driver 150 sequentially applies drive signal to the piezoelectric material as designated by the address signal, in accordance with the direction signal. The driver 150 may determine a point of driving the respective piezoelectric materials based on the clock signals.

The piezoelectric materials in receipt of the drive signal bend to a predetermined direction according to the characteristic of the drive signal, and as a result, the body 100 area where the corresponding piezoelectric materials are located, bend as well. Accordingly, the body 100 changes a form.

As explained above, the piezoelectric materials 110-1~110-$n$ may be arranged in various patterns in the body 100. With reference to the locations of the respective piezoelectric materials 110-1~110-$n$ in the entire area of the flexible device, the controller 130 may divide the plurality of piezoelectric materials into a plurality of groups. For example, referring to FIG. 13, when piezoelectric materials 110-1~110-$n$ are arranged in a plurality of columns and rows, the piezoelectric materials may be grouped in columns or rows. The controller 130 locally deforms the flexible device 1000 by applying different drive signals to the respective groups.

The location, direction or degree of deformation may vary depending on the types of events. The event may include an event to execute a specific application, an event to turn on the power of the flexible device 1000, an event that a user selects a deform menu, an event of receiving new message, mail, messenger, or call, an event to generate information message, or an event to generate error message.

For example, with reference to the piezoelectric material arrangement as the one illustrated in FIG. 13, the controller 130 may apply respective drive signals to the first and second electrode pads 118-1, 118-2 to drive the piezoelectric materials 110-1, 110-4, 110-7 arranged on the first row, to bend the left edge area of the flexible device 1000 to a first or second direction. Accordingly, as the piezoelectric materials 110-1, 110-4, 110-7 on the first row bend to the same direction, the body 100 area bends at the left edge where the piezoelectric materials 110-1, 110-4, 110-7 are arranged.

Meanwhile, when the flexible device 1000 includes the display 120 as in the example illustrated in FIG. 15, the controller 130 may control the display 120 to display a UI screen corresponding to deformation of the body 100, when the body 100 deforms. That is, while deforming the body 100 including the display entirely or partially to a preset form by applying a drive signal to the piezoelectric materials according to type of the event, the controller 130 may control the display 120 to display a certain type of UI screen suitable for the deformation to display the deformation state in appropriate location, size or color.

Although FIG. 15 illustrates a flexible device which includes the display 120, a certain type of flexible device 1000 may not include the display 120.

The controller 130 may deform the body 100 to various forms, by applying various drive signals to the respective piezoelectric materials 110-1~110-$n$.

Figure 16:
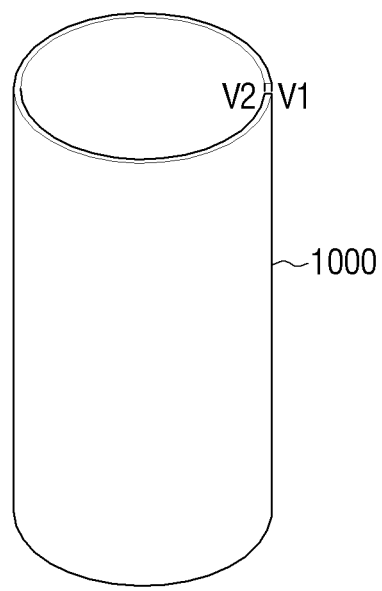
FIGS. 16 to 20 are views provided to explain changing forms of a flexible device according to various exemplary embodiments.

FIGS. 16 to 20 illustrate deformations of the flexible device 1000. Referring to FIG. 16, the flexible device 1000 may be deformed by rolling. The controller 130 may control the driver 150 to apply a first drive signal (V1) to the upper piezoelectric layers of the plurality of piezoelectric materials 110-1~110-$n$ arranged on the entire area of the flexible device 1000, and to apply a second drive signal (V2) to the lower piezoelectric layers. Accordingly, the piezoelectric materials 110-1~110-$n$ bend in the direction of the lower piezoelectric layers, and thus rolling both ends of the body 100 close to contact to each other.

The controller 130 may adjust the degree of deformation of the flexible device by adjusting a size of the drive signal. That is, the body 100 may be rolled when the potential difference between V1 and V2 is large, but the body 100 may be deformed to the extent as illustrated in FIG. 8 when the potential different is reduced. Accordingly, the controller 130 may determine whether the event indicates to roll the flexible device 1000, as illustrated in FIG. 16, or to bend the flexible device 1000 to within a predetermined radius of curvature, as illustrated in FIG. 8, and accordingly adjust the size of the drive signal. The driver 150 generates a drive signal of the size controlled by the controller 130 and outputs the generated signal to the respective piezoelectric materials 110-1~110-$n$.

Figure 17:
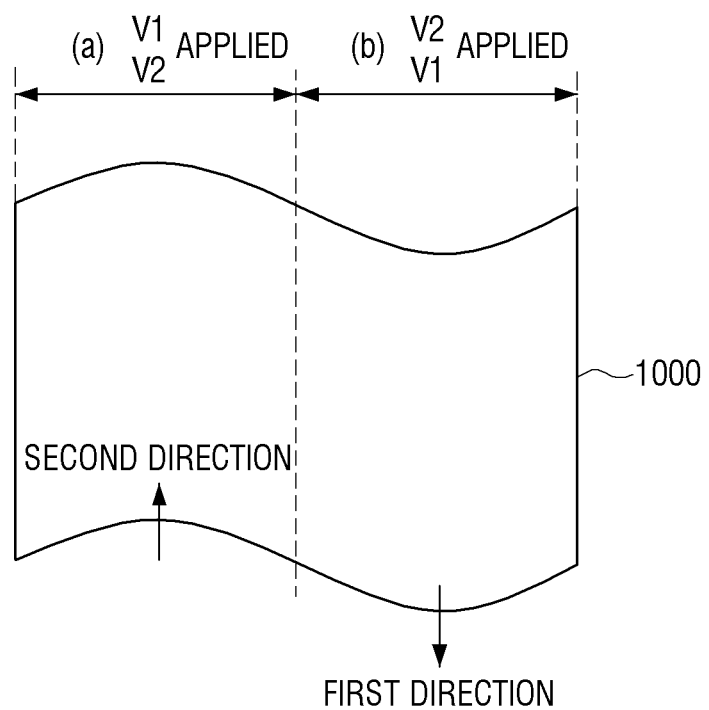
Figure 18:
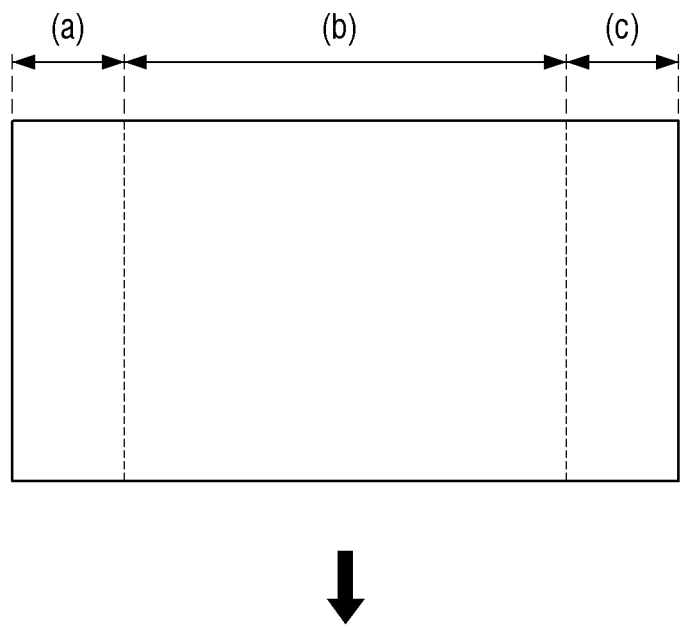
Figure 18:
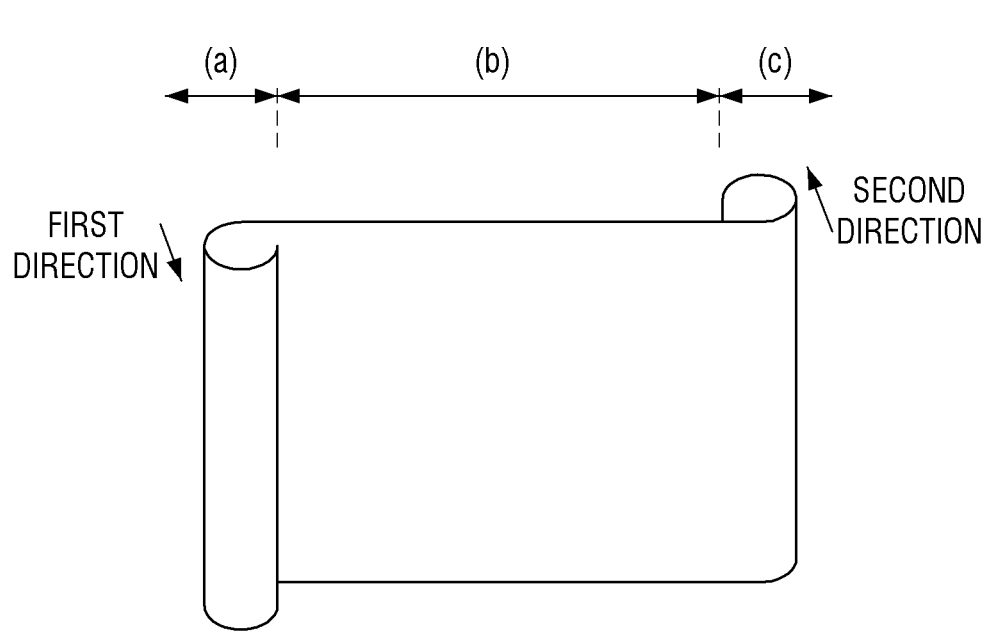

FIGS. 17 and 18 illustrate an example in which the flexible device 1000 deforms differently depending on areas. Referring to FIG. 17, the controller 130 divides the area of the flexible device 1000 into sub-areas (a), (b), (c). The controller 130 controls the driver 150 to apply V2 to the upper piezoelectric layer and V1 to the lower piezoelectric layer for the piezoelectric materials arranged in area (a), to commonly apply V1 to both upper and lower piezoelectric layers for the piezoelectric materials arranged in area (b), and to apply V1 to upper piezoelectric layer and V2 to lower piezoelectric layer for the piezoelectric materials arranged in area (c). As a result, area (a) bends to the first direction, area (b) maintains balance, and area (c) bends to the second direction.

Figure 19:
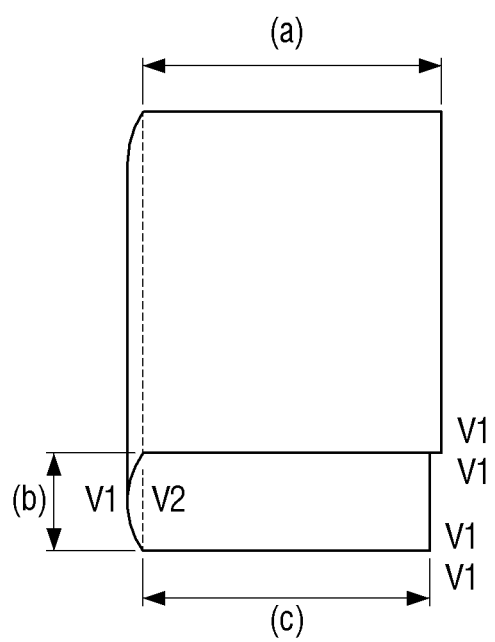

FIG. 19 illustrates another example of the flexible device 1000 employing local deformation. Referring to FIG. 19, the controller 130 divides the entire area of the flexible device 1000 into sub-areas (a), (b), (c). The controller 130 controls the driver 150 to commonly apply the same drive signal V1 to both the upper and lower piezoelectric layers for the piezoelectric materials arranged in areas (a) and (c), and apply V1 to upper piezoelectric layer and V2 to lower piezoelectric layer for the piezoelectric materials arranged in area (b). As a result, areas (a), (c) maintain balanced state and thus are reinforced, while the area (b) bends to the first direction. Accordingly, the flexible device 1000 deforms to a form like the hard cover of a book.

Figure 20:
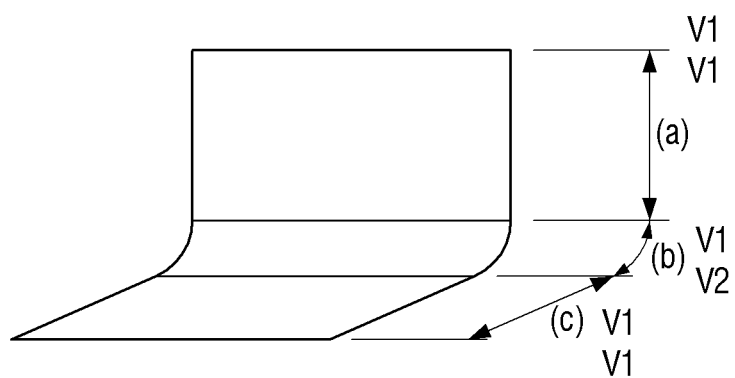

FIG. 20 illustrates the flexible device 1000 employing local deformation according to another exemplary embodiment Like the exemplary embodiment illustrated in FIG. 19, the exemplary embodiment of FIG. 20 also commonly apples the same drive signal (V1) to the upper and lower piezoelectric layers for the piezoelectric materials arranged in areas (a), (c), while applying V1 to the upper piezoelectric layer and V2 to the lower piezoelectric layer for the piezoelectric materials arranged in area (b). The difference from FIG. 19 is that the potential difference is down-adjusted to reduce degree of deformation. That is, as the radius of curvature of area (b) in FIG. 20 is adjusted to be less than that of area (b) of FIG. 19, the flexible device 1000 is deformed to a form representing the outer part of a laptop computer.

As illustrated in FIGS. 16 to 20, it is possible to set the deformation state of the flexible device 1000 according to applications or functions to provide user convenience or meet user satisfaction using the applications or functions. Accordingly, the storage 140 may store information about a deformation state, and applications or setup information matching the deformation state. The controller 130 controls the driver 150 to apply a drive signal that suits the circumstance, based on the information stored at the storage 140.

For example, the driver 150 is controlled to implement the deformation as illustrated in FIG. 16 when a telephone call is received, or as illustrated in FIG. 17 when a specific game program is executed, or as illustrated in FIG. 18 when mail or message is received. The driver 150 is also controlled to implement the deformation as illustrated in FIG. 19 when an e-book or gallery program is executed, or as illustrated in FIG. 20 when word-processor program is executed.

The controller 130 may control the display 120 to display an appropriate user interface (UI) screen upon deformation. For example, when the flexible device 1000 deforms, as illustrated in FIG. 16, the display 120 may display the UI screen in the telephone receiver shape, or display a game screen with the deformation like the one illustrated in FIG. 17. The display 120 may display a screen to check mail or message in area (b) with the deformation illustrated in FIG. 18, or may display a screen of an e-book or gallery program with the deformation illustrated in FIG. 19. The controller 130 may cause the display to display word input window in area (a), and soft keyboard in area (c), with the deformation illustrated in FIG. 20. The controller 130 may cause the display to display texts, symbols, or figures as inputted through the soft keyboard in the word input window. Accordingly, the user is able to use the flexible device 1000 as if using a laptop computer.

Figure 21:
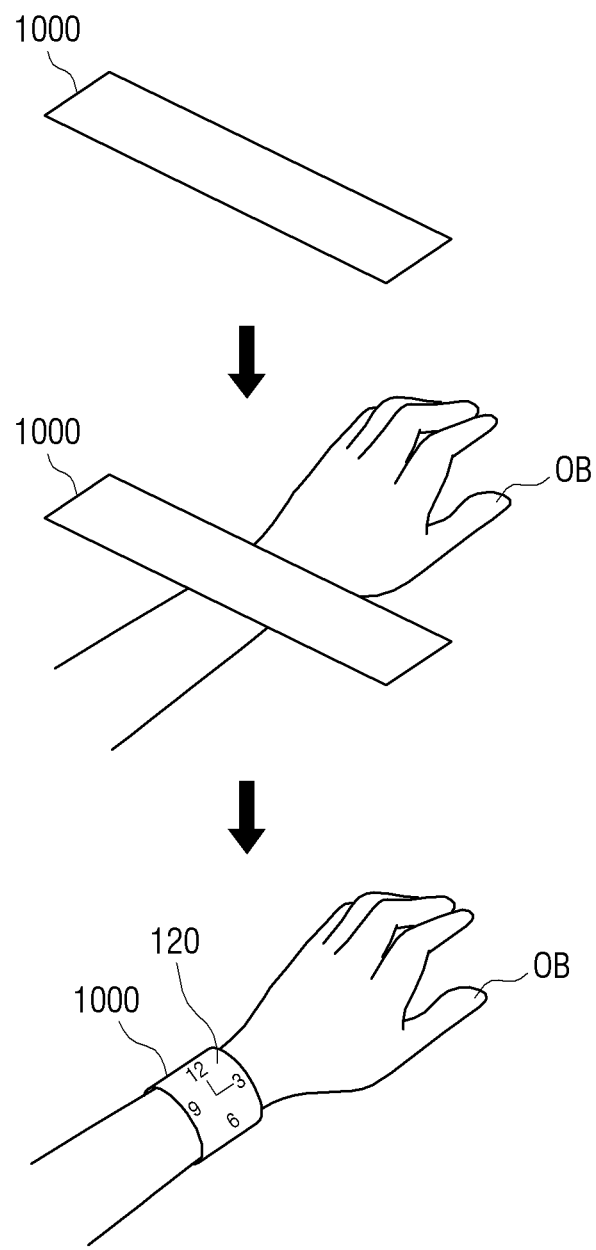
FIG. 21 is a view provided to explain an operation of a flexible device displaying a watch UI thereon.

FIG. 21 is a view provided to explain an example of using the flexible device 1000 according to an exemplary embodiment.

Referring to FIG. 21, the flexible device 1000 is plane when in standby mode. When an operator's body (OB) touches a surface of the flexible device 1000, the controller 130 drives the piezoelectric materials arranged on the entire area of the flexible device 1000 so that the flexible device 1000 rolls around the operator's body OB to mimic the shape of a wrist watch. At the same time, the controller 130 displays a watch UI through the display 120. The watch UI may be displayed on the entire area of the display 120, or alternatively, limitedly displayed around the center of the display 120 as illustrated in FIG. 21.

Although the exemplary embodiment illustrated in FIG. 21 exemplifies a situation where the flexible device 1000 operates as a wrist watch, different functions are equally implementable. For example, referring to FIG. 21, when the operator's body OB touches a surface of the flexible device 1000, the flexible device 1000 may automatically execute MP3 playback function, while displaying through the display 120 a screen to indicate the playback state. Further, when the flexible device 1000 includes an exercise sensor, the calorie-tracker function may be automatically executed, and a screen indicating exercises performed, calories burned, etc. as measured by the calorie-tracker function may be displayed through the display 120.

A touch sensor or a biosensor may be arranged on a rear surface of the flexible device 1000 to detect a touch of the operator's body OB, as illustrated in FIG. 21.

Figure 22:
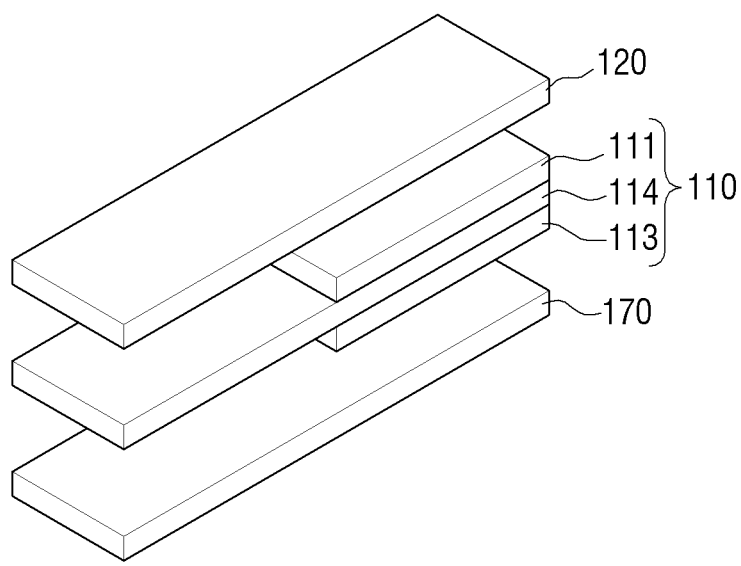
FIG. 22 is a view provided to explain a constitution of a piezoelectric substance additionally including a biosensor.

FIG. 22 is a cross-section view provided to explain a constitution of a flexible device 1000 including a biosensor. Referring to FIG. 21, the flexible device 1000 includes a display 120, a piezoelectric material 110, and a biosensor 170. The biosensor 170 may be arranged on a lower side of the display 120, and the piezoelectric material 110 may be arranged between the display 120 and the biosensor 170.

Although FIG. 21 illustrates one piezoelectric material 110 and the display 120 layered above for convenience of explanation, in actual implementation, a plurality of piezoelectric materials 110 may be distributed across the entire area of the display 120.

The biosensor 170 is arranged under the piezoelectric materials 110. The biosensor 170 may be an electrodermal response (EDA) sensor, or electromuscular response (EMG) sensor.

Although FIG. 22 illustrates the biosensor 170 in the same size and at the same location as the intermediate layer 114 of the piezoelectric materials 110, an exemplary embodiment is not limited to any specific example only. Accordingly, the biosensor 170 may be placed at any location as long as the biosensor 170 is exposed through the lower surface of the body 110 of the flexible device 1000 to directly touch the operator's body (OB). Further, the number and configuration of the biosensor 170 may be varied depending on purpose of the design. In one exemplary embodiment, a plurality of biosensors 170 may be provided at intervals with each other on the rear surface of the flexible device 1000.

The controller 130 rolls the flexible device 1000 by applying different drive signals to the upper and lower piezoelectric layers of the plurality of piezoelectric materials, when the biosensor 170 senses the OB's touch. When there are a plurality of biosensors 170, the flexible device 1000 may be rolled when the entire or more than certain number of biosensors 170 sense the OB's touch.

When the flexible device 1000 is rolled, the controller 130 may display various types of UI screens, such as watch UI, content playback screen, playback progress indicator screen, or exercise counter screen, on at least one area of the display 120.

Meanwhile, although the exemplary embodiments explained above include the piezoelectric materials 110-1~110-n in the same size and shape, and particularly, arranged in the same direction, the direction of arranging the piezoelectric materials may vary depending on embodiments.

Figure 23:
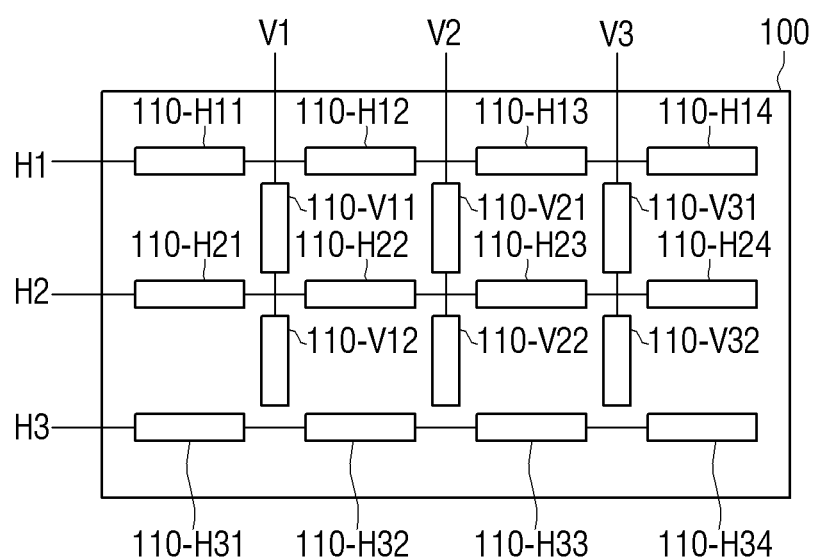
FIG. 23 is a view provided to explain an arrangement pattern of a plurality of piezoelectric substances.

FIG. 23 illustrates a piezoelectric material arrangement pattern of the flexible device according to another exemplary embodiment. Referring to FIG. 23, the body 100 includes a plurality of first piezoelectric materials 110-H11, 110-H12, 110-H13, 110-H14, 110-H21, 110-H22, 110-H23, 110-H24, 110-H31, 110-H32, 110-H33, and 110-H34 arranged in column-wise direction (H1, H2, H3), and a plurality of second piezoelectric materials 110-V11, 110-V12, 110-V21, 110-V22, 110-V31, 110-V32 arranged in row-wise directions (V1, V2, V3). The longer axis of the first piezoelectric material is orthogonal to the longer axis of the second piezoelectric material. Accordingly, the operation is not hindered by the second piezoelectric material when the first piezoelectric material is driven and the deformation in horizontal direction occurs, or vice versa.

The plurality of first and second piezoelectric materials may be arranged on the same layer. Referring to FIG. 23, the rows (V1, V2, V3) on which the second piezoelectric materials are arranged may be arranged between the first piezoelectric materials to allow proper connection between the piezoelectric materials and the electrode patterns.

When the different types of piezoelectric materials with different directions of longer axes are provided together, the flexible device 100 is able to deform not only horizontally, but also vertically.

Although FIG. 23 illustrates an example in which the first and second piezoelectric materials are arranged on the same layer, the piezoelectric materials may be arranged on different layers from each other.

Figure 24:
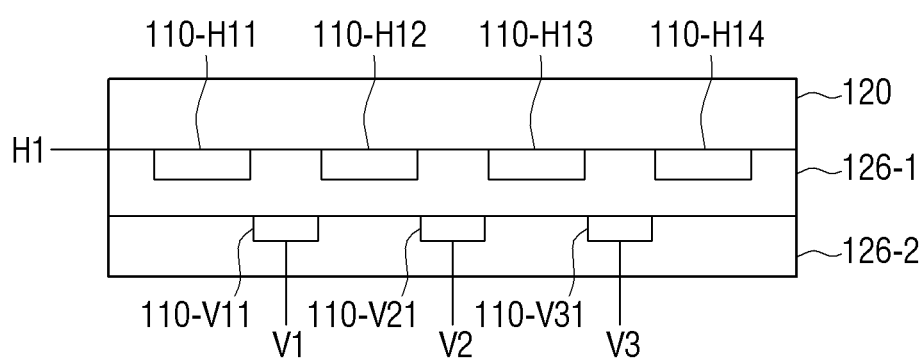
FIG. 24 illustrates a cross-section of the flexible device of FIG. 23.

FIG. 24 is a cross-section of a flexible device including a plurality of piezoelectric materials distributed to different layers. Referring to FIG. 24, a plurality of layers 126-1, 126-2 are sequentially stacked on one surface of the display 120. The plurality of piezoelectric materials are distributed over the plurality of layers 126-1, 126-2.

FIG. 24 is a cross section cut along a column-wise direction of the flexible device 1000. Referring to FIG. 24, the first piezoelectric materials 110-H11, 110-H12, 110-H13, 110-H14 aligned in column-wise direction are successively arranged on the upper layer 126-1, while the second piezoelectric materials 110-V11, 110-V21, 110-V31 aligned in row-wise direction are arranged on the lower layer 126-2.

When the first piezoelectric materials to deform column-wisely and the second piezoelectric materials to deform row-wisely are arranged on different layers from each other, the electrode pattern can be simplified.

Figure 25:
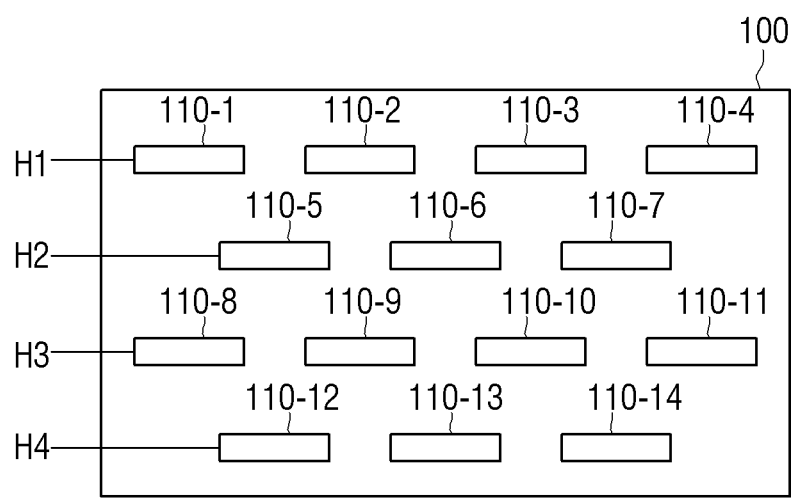
FIG. 25 illustrates an arrangement pattern of a plurality of piezoelectric substances according to another exemplary embodiment.

FIG. 25 illustrates a piezoelectric material arrangement pattern in another exemplary embodiment. Referring to FIG. 25, the plurality of piezoelectric materials 110-1~110-14 are successively aligned in column-wise direction. The piezoelectric materials 110-1, 110-2, 110-3, 110-4, 110-8, 110-9, 110-10, 110-11 included in the odd-numbered columns (H1, H3), and the piezoelectric materials 110-5, 110-6, 110-7, 110-12, 110-13, 110-14 included in the even-numbered columns (H2, H4) are crossed to each other.

The flexible device that includes the piezoelectric materials in the pattern as illustrated in FIG. 25 is able to adjust the degree of deformation without having to adjust the size of the drive signal, by adjusting the driving of the piezoelectric materials in respective columns. To be specific, to roll the flexible device 1000, the controller 130 may drive the piezoelectric materials of the entire columns. On the contrary, to set a smaller degree of deformation, the controller 130 may only drive the odd-numbered or even-numbered columns.

Figure 26:
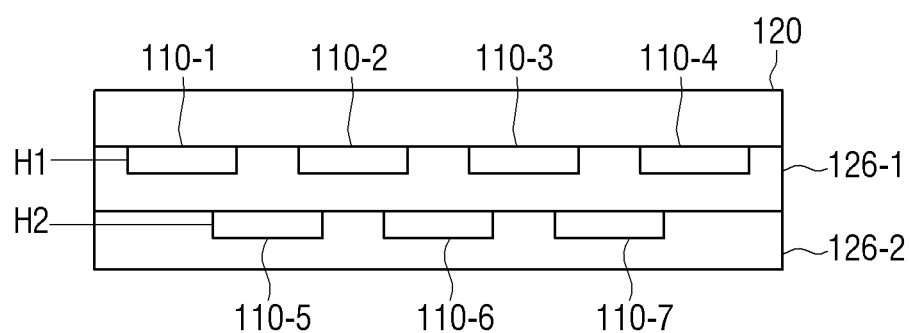
FIG. 26 illustrates cross-section of the flexible device of FIG. 25.

In the exemplary embodiment illustrated in FIG. 25, the respective piezoelectric materials may be distributed over the different layers. FIG. 26 is a cross-section view of a flexible device including piezoelectric materials which are distributed over a plurality of layers.

Referring to FIG. 26, the piezoelectric materials 110-1, 110-2, 110-3, 110-4 corresponding to the odd-numbered columns are arranged on the upper layer 126-1, while the piezoelectric materials 110-5, 110-6, 110-7 corresponding to the even-numbered columns are arranged on the lower layer 126-2.

Meanwhile, referring to FIG. 25, the flexible device 1000 may bend diagonally, when the electrode patterns are connected in the unit of piezoelectric materials as illustrated in FIG. 14.

For example, the second, fifth and eighth piezoelectric materials 110-2, 110-5, 110-8 exclusively bend, when the controller 130 applies drive signal to the second, fifth and eighth piezoelectric materials 110-2, 110-5, 110-8, and not to the rest piezoelectric materials. As a result, a bending line is formed, connecting the second, fifth, and eighth piezoelectric materials 110-2, 110-5, 110-8, so that the deformation occurs with reference to the bending line, in which the left corner bends upward or downward.

While the exemplary embodiments explained above have piezoelectric materials arranged with longer axes aligned to column-wise or row-wise directions, the arrangement pattern of the piezoelectric materials may vary. For example, the longer axes of the piezoelectric materials may be aligned in diagonal direction. Further, instead of being distributed to the entire area of the body 100 of the flexible device 1000, the piezoelectric materials may be successively arranged along an edge area in one or two lines.

Figure 27:
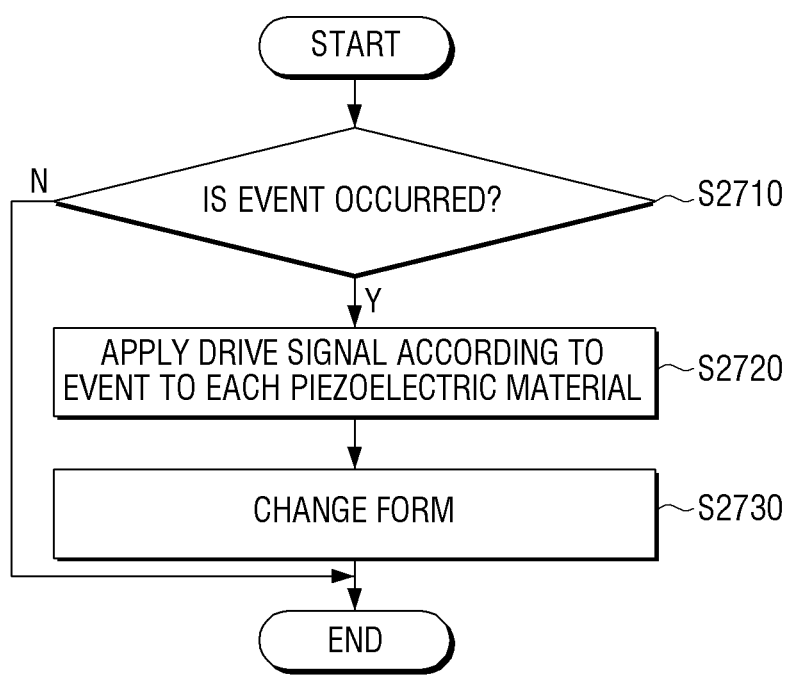
FIG. 27 is a flowchart provided to explain an operating method of changing a form of a flexible device using a plurality of piezoelectric substances.

FIG. 27 is a flowchart provided to explain an operating method of a flexible device according to an exemplary embodiment. Referring to FIG. 27, when a preset event occurs at S2710, the flexible device 1000 applies a corresponding driving signal to the respective piezoelectric materials corresponding to the event, at S2720.

As explained above, the piezoelectric material may include upper and lower piezoelectric layers. The drive signal may be individually determined for the respective piezoelectric materials, depending on the type of the event. That is, the operation to apply drive signal may include individually determining drive signals to apply to upper and lower piezoelectric layers within the plurality of piezoelectric materials, depending on the type of event, and applying the determined drive signals to the upper and lower piezoelectric materials.

With the application of the drive signals, the respective piezoelectric materials deform. The direction of deformation is, as explained above, determined by the relationship between the drive signals applied to the upper and lower piezoelectric layers. At S2730, when the respective piezoelectric materials deform, the shape of the body 100 of the flexible device deforms where the piezoelectric materials are arranged deform. The shape of the body 100 may be deformed variously, depending on the location of the driven piezoelectric materials, polarity of the drive signals, or magnitude of the drive signals. The arrangement pattern or method for driving the piezoelectric materials will not be additionally explained below, but referenced to the above corresponding explanations.

Meanwhile, as explained above, the piezoelectric materials may be categorized into a plurality of groups according to locations thereof, in which case it is possible to locally deform the flexible device by applying different drive signals to the respective groups.

The flexible device 1000 may automatically deform to suit various services the flexible device 1000 provides. The flexible device 1000 may be implemented as a variety of devices. For example, the flexible device 1000 may be implemented as a mobile phone, a PDA, a laptop computer, a MP3 player, an e-book device, a remote controller, or any new form of device.

Figure 28:
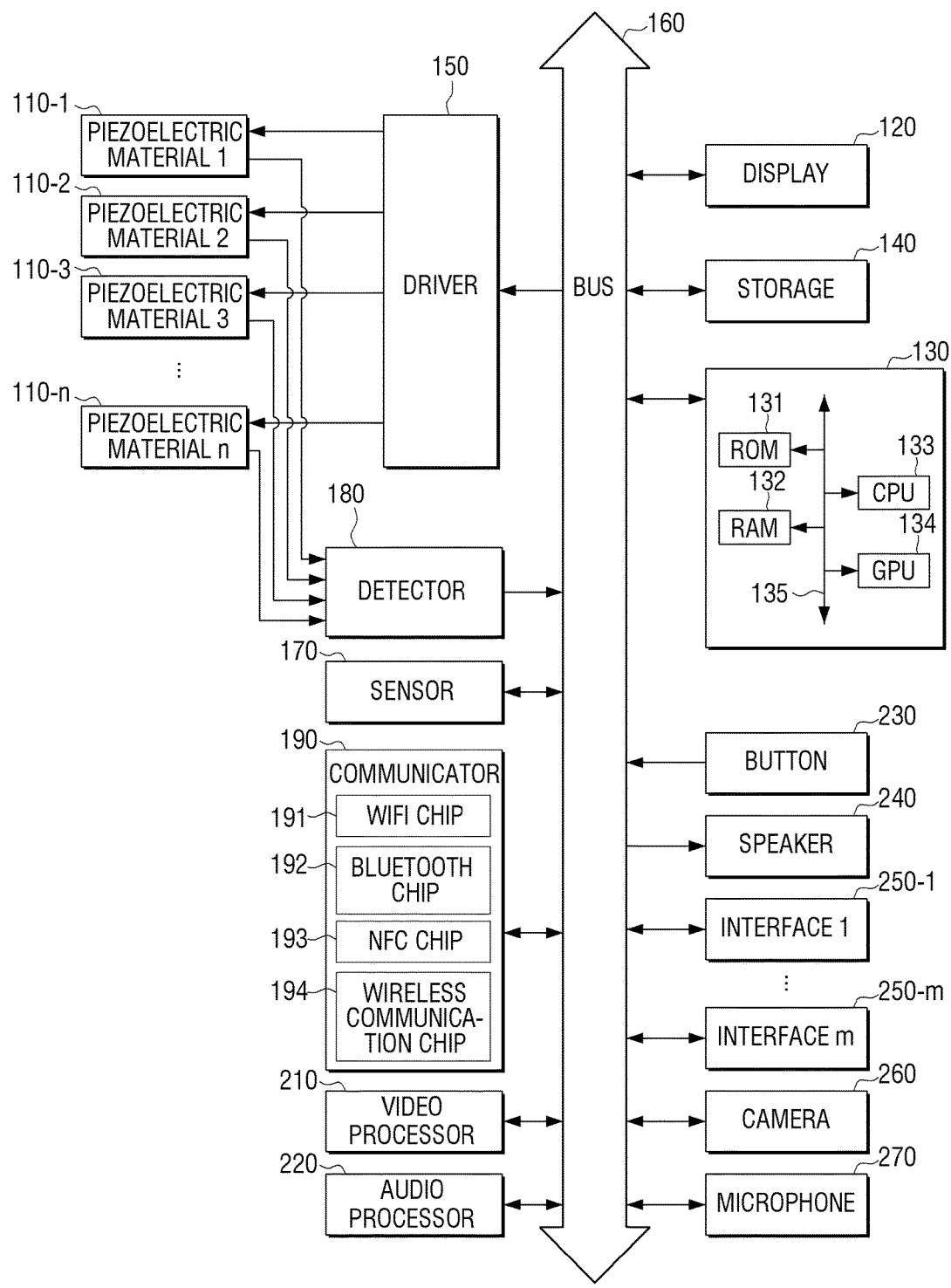
FIG. 28 is a block diagram provided to explain a constitution of a flexible device according to various exemplary embodiments.

FIG. 28 is a view provided to explain a constitution of the flexible device 1000 according to another embodiment. Referring to FIG. 28, the flexible device 1000 includes a plurality of piezoelectric materials 110-1~110-n, a display 120, a controller 130, a storage 140, a driver 150, a bus 160, a sensor 170, a detector 180, a communicator 190, a video processor 210, an audio processor 220, a button 230, a speaker 240, interfaces 250-1~250-m, a camera 260, and a microphone 270.

The constitution and operation of the plurality of piezoelectric materials 110-1~110-n, the display 120, the controller 130, the storage 140, the driver 150, and the bus 160 will not be additionally explained below.

As explained with reference to FIG. 22, the sensor 170 may include a biosensor arranged on one side of the body 100 to detect presence of touch by an operator's body (OB).

The sensor 170 may additionally include electromagnetic sensor, a gyro sensor, an acceleration sensor or a touch sensor. The electromagnetic sensor senses rotational status and direction of movement of the flexible device 1000. The gyro sensor detects rotational angle of the flexible device 1000. Both the electromagnetic sensor and the gyro sensor may be provided, but it is possible to detect the rotational status of the flexible device 1000 even when only one of these is provided. The acceleration sensor operates to sense the degree of tilting of the flexible device 1000. The touch sensor may be capacitive or resistive. The capacitive sensor uses dielectric material coated on the surface of the display 120 to sense microcurrent excited by the operator's body touching the surface of the display 120, and calculate touch coordinates. The resistive sensor includes two electrode plates so that, when the operator touches the screen, the contact between the upper and lower plates at the touched spot enables detection of the current flow and calculation of touch coordinates. As explained above, the touch sensor may be variously implemented. The touch sensor may be arranged on the rear surface of the flexible device 1000 and used to sense the operator's touch. The biosensor may be omitted, when the touch sensor is provided on the rear surface.

The detector 180 is connected to the respective piezoelectric materials 110-1~110-*n* to detect a signal from the piezoelectric materials. When the operator bends the body 100, pressure is exerted on the piezoelectric materials 110-1~110-*n* at the bent area. As explained above, under the pressure, the piezoelectric materials 110-1~110-*n* generate piezoelectric effect. As a result, the piezoelectric materials 110-1~110-*n* generate electric signal in size corresponding to the pressure.

The controller 130 determines the deformation state of the body 100 based on the change in the electric signal as detected at the detector 180. To be specific, based on the location of the piezoelectric materials 110-1~110-*n* where the change of electric signal is detected, the controller 130 determines the area having deformed. Referring to FIG. 2, when the respective piezoelectric materials 110-1~110-*n* are arranged on the rear surface of the flexible device 1000, the compressive force is exerted on the upper piezoelectric layer and the tensile force is exerted to the lower piezoelectric layer, upon bending to the direction of the display 120. In this case, (+) polarity electric signal is outputted from the piezoelectric materials 110-1~110-*n*. With the bending in opposite direction, the piezoelectric materials 110-1~110-*n* output (−) polarity electric signal. Based on the polarity of the electric signal as detected from the piezoelectric materials 110-1~110-*n*, the controller 130 determines the direction of bending. Further, the controller 130 is able to determine intensity of deformation based on the size of electric signal. Further, the controller 130 may determine deformation duration, by counting the time duration of detecting the electric signal.

As explained above, when determining area, direction, intensity or time of bending are determined, the controller 130 may determine the deformation state of the flexible device 1000 by comprehensively analyzing the determined results. The deformation state may include general bending, folding, multi-bending, bending and move, bending and flat, bending and hole, bending and twist, twist, swing, shaking, rolling, or various others.

The storage 140 stores information about controlling operation corresponding to the respective deformation state. The controller 130 performs corresponding control operation according to the deformation state, based on the information stored at the storage 140. To be specific, the controller 130 may perform operation including, for example, turn-on, turn-off, channel zapping, volume adjustment, application execution, cursor moving, content playback, web browsing, page shifting, screen quality adjustment, or various other operations.

The communicator 190 is configured to perform communication with various types of external devices according to various types of communication methods. The communicator 190 may include a WiFi chip 191, a Bluetooth chip 192, an NFC chip 193, a wireless communication chip 194 or various other communication chips.

The WiFi chip 191, the Bluetooth chip 192, and the NFC chip 193 may perform communication by WiFi, Bluetooth and NFC methods. The NFC chip 193 operates by near field communication (NFC) manner, using 13.56 MHz among various RF-ID frequency bands such as 135 kHz, 13.56 MHz, 433 MHz, 860~960 MHz, 2.45 GHz. When the WiFi chip 191 or Bluetooth chip 192 is used, the connection-related information, such as SSID and session key, may be first transmitted and received so that communication is connected for information transmission and reception. The wireless communication chip 194 performs communication according to various communication specifications such as IEEE, Zigbee, 3rd generation (3G), 3rd generation partnership project (3GPP), or long term evolution (LTE).

The flexible device 1000 may additionally include a global positioning system (GPS) chip or digital multimedia broadcasting (DMB) receiving module.

The video processor 210 handles video data processing. The video processor 210 may perform various image processing such as, for example, decoding, scaling, noise filtering, frame rate conversion, or resolution conversion of the video data.

The audio processor 220 handles audio data processing. The audio processor 220 may perform various processing of audio data such as, for example, decoding, amplification, noise filtering, or others.

The audio and video processors 220, 210 are used to process and playback multimedia content or DMB signal.

The display 120 displays video frames processed at the video processor 210. The speaker 240 is configured to output not only the various audio data processed at the audio processor 220, but also various alarm sounds or voice messages.

The button 230 may include various types of buttons such as a mechanic button, touch pad, or wheel formed on a predetermined area such as front, side or rear side of the outer portion of the body of the flexible device 1000.

The camera 260 is configured to capture still or video images according to control of the user. A plurality of cameras 260 including front camera and rear camera may be provided.

The microphone 270 is configured to receive user voice or other sounds and convert the same into audio data. The controller 130 may use the user voice inputted through the microphone 270 during a call, or convert the same into audio data and stored at the storage 140.

When the camera 260 and the microphone 270 are provided, the controller 130 may perform a control operation according to a user voice as inputted through the microphone 270 or a user motion as perceived through the camera 260. That is, the flexible device 1000 may operate in motion control mode or voice control mode, in addition to being controlled according to deformation or touch. When operating in motion control mode, the controller 130 may activate the camera 260 to capture the user, trace the change in the user's motion and accordingly perform control operation. When in voice control mode, the controller 130 may operate in voice recognition mode to analyze the user voice as inputted through the microphone 270 and control according to the analyzed user voice. The controller 130 may control the driver 150 to drive the respective piezoelectric materials 110-1~110-n based on the user voice, user motion or button 230 manipulation. Accordingly, the form of the flexible device 1000 is deformed appropriately according to the user control.

Additionally, various interfaces 250-1~250-m may be provided to connect to various external terminals such as headset, mouse, or LAN. Further, although not illustrated, the flexible device 1000 may additionally include a power source (not illustrated). The power source supplies electricity to the respective components of the flexible device 1000. The power source may be flexible so as to bend along with the flexible display apparatus 100. In such a situation, the current collector, electrode, electrolyte, or clad may be formed from a flexible material.

Meanwhile, the operation of the controller 130 as explained above may be performed according to the program stored at the storage 140. The storage 140 may store various data including, for example, O/S software to drive the flexible device 1000, various applications, data inputted or set during execution of the applications, contents, bending gesture, or drive information of the pm.

The controller 130 controls the overall operations of the flexible device 1000 using the various programs stored at the storage 140.

The controller 130 may include a read only memory (ROM) 131, a random access memory (RAM) 132, a central processing unit (CPU) 133, a graphic processing unit (GPU) 134, and a system bus 135.

The ROM(131), RAM(132), CPU(133), and GPU(134) may be connected to each other via the system bus 135.

The CPU 133 accesses the storage 140 and performs booting using the O/S stored at the storage 140. The CPU 133 performs various operations using the programs, contents or data stored at the storage 140.

The ROM 131 stores a command set for system booting. When electricity is supplied in response to turn-on command, the CPU 133 copies the O/S stored at the storage 140 onto the RAM 132, executes the O/S and boots up the system, according to the command stored at the ROM 131. When booting completes, the CPU 133 copies various application programs stored at the storage 140 onto the RAM 132, and executes the copied application programs of the RAM 132 to perform various operations.

When the above-mentioned event occurs, the CPU 133 transmits address information, direction information, drive signal information, etc. of the piezoelectric materials 110-1~110-n to deform to the driver 150 so that the body 100 deforms according to the event. The driver 150 generates a drive signal to be applied to the respective piezoelectric materials 110-1~110-n and outputs the same according to the control of the CPU 134.

Further, when a detect signal corresponding to the deformation state is received from the detector 180, the CPU 133 determines the deformation state that corresponds to the detect signal. Upon completing the determination, the CPU 133 confirms through the storage 140 the information about the function that matches the deformation state, and loads the application to perform the function from the RAM 132 and executes the same.

The GPU 134 generates a screen including various objects such as icons, images or text, using the calculator (not illustrated) and the renderer (not illustrated). The calculator calculates attribute values, such as coordinates, configuration, size or color, to display the respective objects according to the screen layout. The renderer generates screens of various layouts including objects therein, based on the attribute values as calculated at the calculator. The screens generated at the renderer are displayed within the display area of the display 120.

As explained above with reference to FIG. 28, when piezoelectric materials are provided, the shape of the flexible device may be automatically deformed using the piezoelectric materials, or the current deformation state may be detected using the piezoelectric materials. As a result, without having to use separate bend sensors, it is possible to easily determine to which shape the deformation occurs.

Meanwhile, FIG. 28 illustrates the respective components of the flexible device implemented as an apparatus incorporating therein multiple functions including communication, broadcasting, and video playback. Accordingly, depending on embodiments, some of the components illustrated in FIG. 28 may be omitted or modified, or other components may be added.

As explained above, the controller 130 may perform various operations by executing the programs stored at the storage 140.

Figure 29:
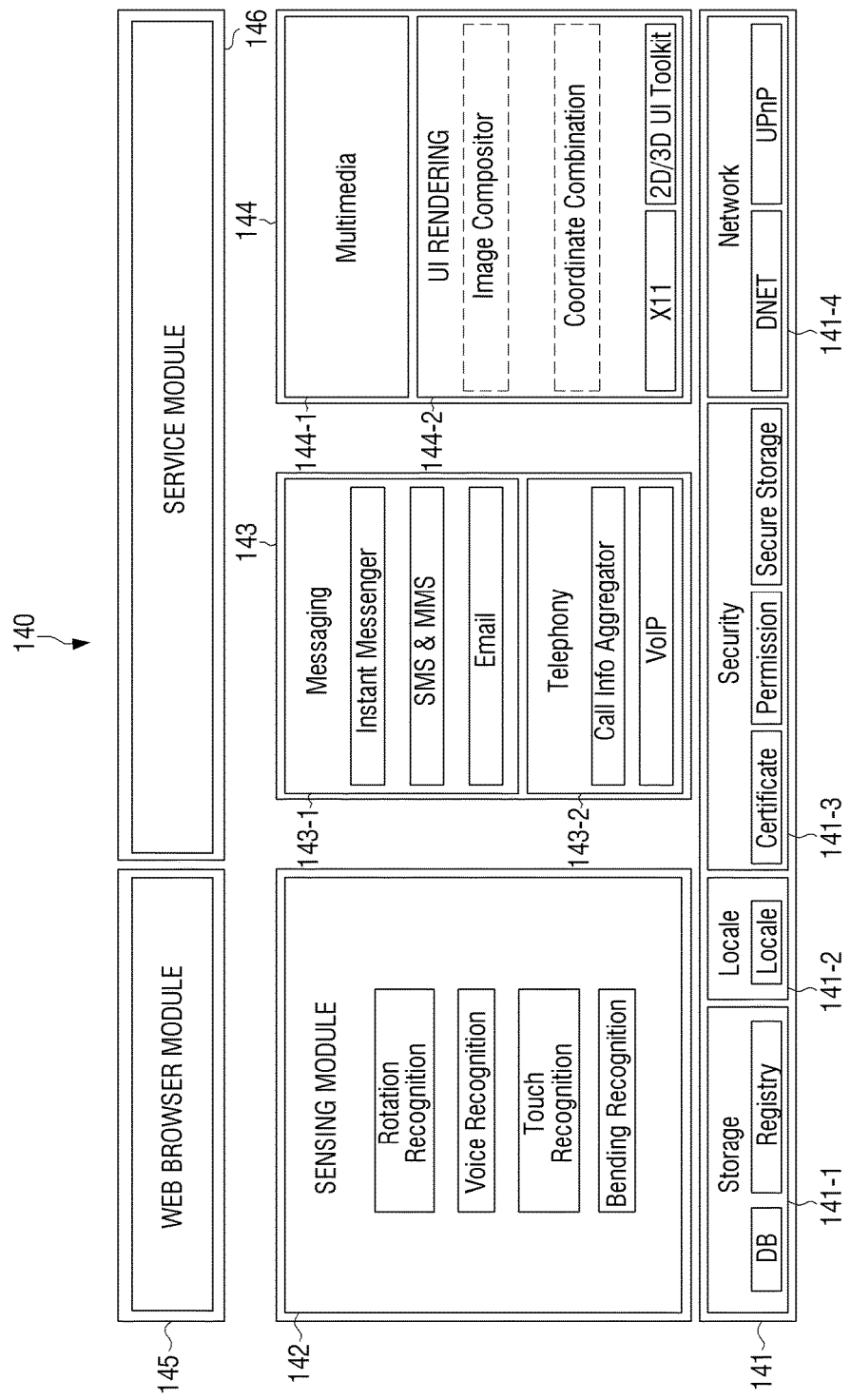
FIG. 29 is a view provided to explain a constitution of software used in flexible device.

FIG. 29 is a view provided to explain a constitution of the software stored at the storage 140. Referring to FIG. 29, the storage 140 may store software that includes a base module 141, a sensing module 142, a communication module 143, a presentation module 144, a web browser module 145, and a service module 146.

The base module 141 processes signals transmitted from the hardware included in flexible device 1000 and transmits the same to the upper layer module.

The base module 141 includes a storage module 141-1, a location-based module 141-2, a security module 141-3, and a network module 141-4.

The storage module 141-1 manages database (DB) or registry. The CPU 133 accesses the database within the storage 140 using the storage module 141-1 to read out various data. The location-based module 141-1 is a program module that supports location-based service in association with various hardware such as GPS chip, or the like. The security module 141-3 is a program module that supports certification, permission, or secure storage of the hardware, and the network module 141-4 supports network connection and includes DNET module, or UPnP module.

The sensing module 142 collects information from the respective sensors of the detector 180, analyzes and manages the collected information. To be specific, the sensing module 142 performs detection of manipulation attributes such as coordinates of the point of touch, direction of moving touch, velocity of movement, or distance of movement. Depending on embodiments, the sensing module 142 may include rotation recognition module, voice recognition module, touch recognition module, motion recognition module, or bending recognition module. The bending recognition module is the software that analyzes detect signal at the detector 180 to determine deformation state in the manner explained above.

The communication module 143 performs communication with outside. The communication module 143 may include a messaging module 143-1 such as a messenger program, a short message service (SMS) & multimedia message service (MMS) program, or e-mail program, or a call module 143-2 such as a call info aggregator program module, or a VoIP module.

The presentation module 144 constructs a display screen. The presentation module 144 includes a multimedia module 144-1 to playback and output multimedia content, and a UI rendering module 144-2 to process UI and graphics. The multimedia module 144-1 may include a player module, a camcorder module, or a sound processing module. Accordingly, the presentation module 144 plays back various multimedia contents and generates and plays screen and audio. The UI rendering module 144-2 may include an image compositor module which compose images, a coordinate combine module which combines coordinates on a screen to display an image, an XII module which receives various events from the hardware, or a 2D/3D UI toolkit which constructs 2D or 3D UI.

The web browser module 145 web-browsers and accesses web server. The web browser module 145 may include various modules such as web view module to construct a web page, a download agent module to perform downloading, a bookmark module, or webkit module.

The service module 146 includes various applications to provide services that match a manipulation, when the user manipulation such as deformation, user voice, motion, touch, button manipulation is inputted. For example, the service module 146 may include word program, e-book program, calendar program, game program, schedule management program, alarm management program, content playback program, navigation program, or widget program. When the programs executed accompany deformation, the controller 130 controls the driver 150 to ensure that the deformation occurs as indicated by the program. The examples of the deformation will not be redundantly explained, but referenced to the above corresponding description.

Although various program modules are illustrated in FIG. 29, the program modules as illustrated may be partially omitted, modified, or some may be added, depending on types and characteristics of the flexible device 1000. For example, when the flexible device 1000 is implemented as a remote controller type with flexibility and control function on external devices, and without display function, the modules such as the presentation module 144, the web browser module 145 or the service module 146 may be omitted. In this case, the module to detect characteristic of the deformation state, and registry to designate information on the control signal matching the detected result may be stored at the storage 140 for use.

Meanwhile, as explained above, the flexible device 1000 may use both the first and second piezoelectric effects of the piezoelectric materials.

Figure 30:
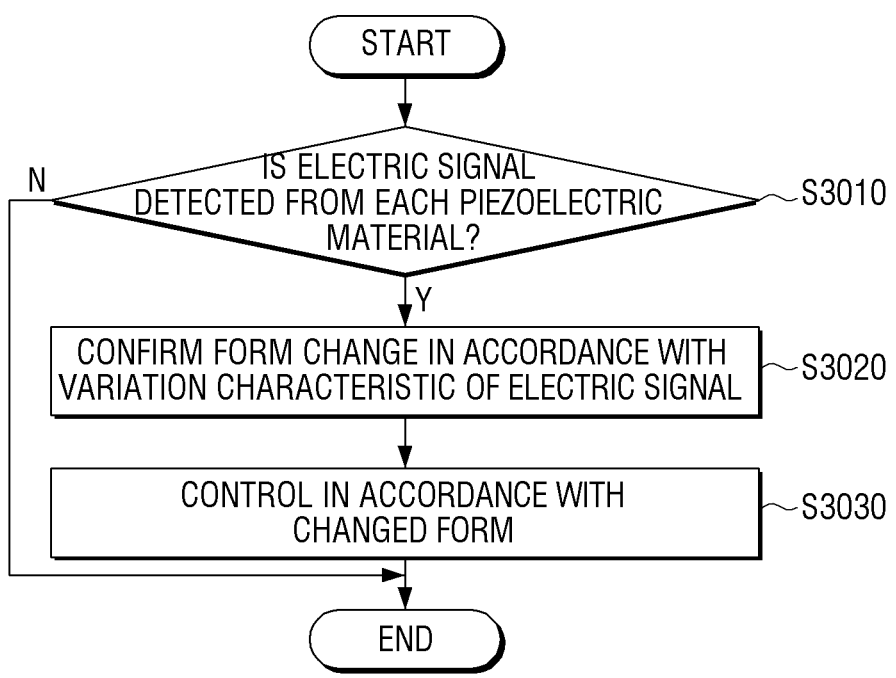
FIG. 30 is a flowchart provided to explain an operating method of controlling an operation of a flexible device by sensing a changed form of the flexible device using a plurality of piezoelectric substances.

FIG. 30 is a flowchart provided to explain an operation method of a flexible device using the first piezoelectric effect.

Referring to FIG. 30, at S3010, the flexible device constantly monitors to detect electric signals at the respective piezoelectric materials. When the electric signals are detected, at S3020, the flexible device 1000 checks the deformation state that corresponds to the change characteristic of the electric signals. The method for determining deformation state will not be redundantly explained below.

At S3030, upon checking the deformation state, the flexible device 1000 performs a control operation corresponding to the state. Since the examples of the deformation state and control operations corresponding thereto have been also explained above, this is also omitted below for the sake of brevity.

As explained above, according to various exemplary embodiments, it is possible to freely deform the flexible device 1000 using a plurality of piezoelectric materials arranged in the flexible device 1000.

Further, since it is possible to detect the deformation state of the flexible device 1000 using the piezoelectric materials, the user is able to select and execute various functions by deforming manipulation.

As a result, utilization and user satisfaction of using flexible device improve.

Meanwhile, the operation method of the flexible device according to various exemplary embodiments may be implemented as a program for use in the flexible device.

To be specific, a non-transitory computer readable medium storing therein a program may be provided, in which the program includes steps of determining whether or not a preset event occurs, and when the event occurs, applying a drive signal individually to a plurality of piezoelectric materials mounted at different locations of the flexible device.

The non-transitory computer readable medium refers to a medium which is readable by a device and which stores data semi-permanently, instead of that which briefly stores the data such as register, cache, or memory. To be specific, the various applications or programs as explained above may be stored and provided on the non-transitory computer readable medium such as CD, DVD, hard disk, blu-ray disk, USB, memory card, or ROM.

The foregoing exemplary embodiments and advantages are merely exemplary and are not to be construed as limiting the exemplary embodiments. The present teaching can be readily applied to other types of apparatuses. Also, the description of the exemplary embodiments of the present inventive concept is intended to be illustrative, and not to limit the scope of the claims.

What is claimed is:

1. A flexible device comprising:
   a flexible body;
   a first plurality of piezoelectric materials arranged in rows on the flexible body, wherein a longer axis of each of the first plurality of piezoelectric materials is in a vertical direction of the flexible device;
   a second plurality of piezoelectric materials arranged in columns on the flexible body, wherein a longer axis of each of the second plurality of piezoelectric materials is in a horizontal direction of the flexible device;
   a flexible display panel supported by the flexible body;
   a storage configured to store information of a plurality of deformation states and information of at least one application matching the plurality of deformation states, respectively; and
   a controller configured to, in response to executing an application among the at least one application, apply a drive signal to at least one row of the first plurality of piezoelectric materials or at least one column of the second plurality of piezoelectric materials according to a deformation state matching the executed application, causing the at least one row of the first plurality of piezoelectric materials to deform in the vertical direction of the flexible device or the at least one column of the second plurality of piezoelectric materials to deform in the horizontal direction of the flexible device.

2. The flexible device of claim 1, wherein the drive signal comprises a first drive signal and a second drive signal,
wherein the first plurality of piezoelectric materials deform in a first direction, in response to application of the first drive signal to the first plurality of piezoelectric materials of a lower piezoelectric layer and the second plurality of piezoelectric materials deform in a second direction, in response to application of the second drive signal to the second plurality of piezoelectric materials of an upper piezoelectric layer disposed on the lower piezoelectric layer, and
wherein the first plurality of piezoelectric materials and the second plurality of piezoelectric materials maintain a balanced state, in response to application of the first drive signal or the second drive signal to the first plurality of piezoelectric materials and the second plurality of piezoelectric materials.

3. The flexible device of claim 2, wherein the controller divides the first plurality of piezoelectric materials and the second plurality of piezoelectric materials into a plurality of groups based on locations at which the first plurality of piezoelectric materials and the second plurality of piezoelectric materials are disposed, and applies different ones of the first drive signal and the second drive signal to the respective groups to cause the grouped first plurality of piezoelectric materials and the second plurality of piezoelectric materials to locally deform.

4. The flexible device of claim 3, further comprising a display,
wherein the first plurality of piezoelectric materials and the second plurality of piezoelectric materials are disposed on a lower portion of the display,
wherein the controller selectively applies the first drive signal and the second drive signal to the first plurality of piezoelectric materials and the second plurality of piezoelectric materials based on a type of the executed application, and
wherein the controller controls the display to display a user interface (UI) corresponding to the deformation state of the flexible body.

5. The flexible device of claim 1, further comprising a display; and
at least one biosensor configured to detect a touch of a user arranged on lower side of the display,
wherein the first plurality of piezoelectric materials and the second plurality of piezoelectric materials are disposed between the display and the at least one biosensor, and
the controller selectively applies the first drive signal and the second drive signal to the first plurality of piezoelectric materials and the second plurality of piezoelectric materials and controls the display to display a user interface on the display, in response to the at least one biosensor detecting the touch of the user.

6. The flexible device of claim 1, wherein the first plurality of piezoelectric materials, an intermediate layer, and the second plurality of piezoelectric materials are stacked sequentially on one side of the flexible body.

7. The flexible device of claim 1, wherein the magnitude of the drive signal corresponds to a degree of deformation of the at least one of the first plurality of piezoelectric materials and the second plurality of piezoelectric materials.

8. The flexible device of claim 1, further comprising a detector configured to detect an electric signal generated from one or more piezoelectric materials of the first plurality of piezoelectric materials and the second plurality of piezoelectric materials in response to a deformation of the flexible body,
wherein the controller determines a deformation state of the flexible body based on a change in the electric signal and performs a control operation corresponding to the determined deformation state.

9. A method for operating a flexible device, comprising:
detecting, by a controller of the flexible device, execution of an application; and
selectively applying drive signals to at least one row of a first plurality of piezoelectric materials arranged in rows on a flexible body or at least one column of a second plurality of piezoelectric materials arranged in columns on the flexible body, based on a deformation state matching the executed application, wherein the drive signals cause deformation of the at least one row of the first plurality of piezoelectric materials in a vertical direction of the flexible device or the at least one column of the second plurality of piezoelectric materials in a horizontal direction of the flexible device,
wherein the deformation state is a deformation state which is matched to the executed application from among a plurality of pre-stored deformation states, and
wherein a longer axis of each of the first plurality of piezoelectric materials is in the vertical direction of the flexible device and a longer axis of each of the second plurality of piezoelectric materials is in the horizontal direction of the flexible device.

10. The method of claim 9, wherein the selectively applying drive signals comprises:
determining drive signals to apply to the first plurality of piezoelectric materials and the second plurality of piezoelectric materials based on the type of the executed application; and
applying the determined drive signals to the first plurality of piezoelectric materials and the second plurality of piezoelectric materials,
wherein the first plurality of piezoelectric materials deform in a first direction in response to application of a first drive signal to the first plurality of piezoelectric materials of a lower piezoelectric layer and the second plurality of piezoelectric materials deform in a second direction, in response to application of the second drive signal to the second plurality of piezoelectric materials of an upper piezoelectric layer, and
wherein the first plurality of piezoelectric materials and the second plurality of piezoelectric materials maintain a balanced state, in response to application of the first drive signal or the second drive signal to the first plurality of piezoelectric materials and the second plurality of piezoelectric materials.

11. The method of claim 9, wherein the selectively applying comprises:
dividing the first plurality of piezoelectric materials and the second plurality of piezoelectric materials into a plurality of groups based on locations at which the first plurality of piezoelectric materials and the second plurality of piezoelectric materials are disposed; and
applying different ones of the drive signals to the respective groups to cause the grouped first plurality of piezoelectric materials and the second plurality of piezoelectric materials to locally deform.

12. The method of claim 9, further comprising displaying a user interface (UI) corresponding to the deformation state of the flexible device on a display of the flexible device.

13. The method of claim 9, further comprising:
detecting a touch of a user through a biosensor provided on the flexible device;
selectively applying the drive signals to the first plurality of piezoelectric materials and the second plurality of piezoelectric materials and displaying a user interface on a display of the flexible device, in response to detecting the touch of the user through the biosensor provided on the flexible device.

14. The method of claim 9, wherein the magnitudes of the drive signals correspond to degree of deformations of the first plurality of piezoelectric materials and the second plurality of piezoelectric materials.

15. The method of claim 9, further comprising:
detecting an electric signal generated from one or more piezoelectric materials of the first plurality of piezoelectric materials and the second plurality of piezoelectric materials in response to a deformation of the flexible body;
determining deformation state of the flexible device based on a change in the electric signal; and
performing a control operation corresponding to the determined deformation state.

16. A flexible device comprising:
a flexible body;
a first plurality of elongated piezoelectric materials supported by the flexible body, the first plurality of elongated piezoelectric materials arranged in rows orthogonal to elongated axes of the first plurality of elongated piezoelectric materials;
a second plurality of elongated piezoelectric materials supported by the flexible body, the second plurality of elongated piezoelectric materials arranged in columns which are orthogonal to the rows of the first plurality of elongated piezoelectric materials and orthogonal to elongated axes of the second plurality of elongated piezoelectric materials, the second plurality of elongated piezoelectric materials in each of the columns disposed in spaces between the rows of the first plurality of elongated piezoelectric materials;
a storage configured to store information of a plurality of deformation state and information of at least one application matching the plurality of deformation states, respectively; and
a controller configured to, in response to executing an application among the at least one application, apply a drive signal, selectively, to at least one row of the first plurality of elongated piezoelectric materials or at least one column of the second plurality of elongated piezoelectric materials according to a deformation state matching the executed application, causing the at least one row of the first plurality of elongated piezoelectric materials to be deform from the second plurality of elongated piezoelectric materials in the vertical direction of the flexible device or the at least one column of the second plurality of elongated piezoelectric materials to be deform from the first plurality of elongated piezoelectric materials in the horizontal direction of the flexible device,
wherein the elongated axes of the first plurality of elongated piezoelectric materials are in the vertical direction of the flexible device and the elongated axes of the second plurality of elongated piezoelectric materials are in the horizontal direction of the flexible device.

17. The flexible device of claim 16, wherein the first plurality of elongated piezoelectric materials and the second plurality of elongated piezoelectric materials are disposed in different layers of piezoelectric materials.

18. The flexible device of claim 17, wherein the first plurality of elongated piezoelectric materials are disposed in a lower piezoelectric layer and the second plurality of elongated piezoelectric materials are disposed in an upper piezoelectric layer disposed on the lower piezoelectric layer.

19. The flexible device of claim 16, wherein the first plurality of elongated piezoelectric materials and the second plurality of elongated piezoelectric materials are disposed in a single layer of piezoelectric materials.

* * * * *